US010770771B2

(12) United States Patent
Michaelis et al.

(10) Patent No.: US 10,770,771 B2
(45) Date of Patent: Sep. 8, 2020

(54) VARIABLE CAPACITORS AND SWITCHES FABRICATED USING ELECTROWETTING ON DIELECTRIC TECHNIQUES AND RELATED PHASE SHIFTERS, BASE STATION ANTENNAS AND OTHER DEVICES

(71) Applicant: CommScope Technologies LLC, Hickory, NC (US)

(72) Inventors: Scott L. Michaelis, Plano, TX (US); Igor Timofeev, Dallas, TX (US); Michael Brobston, Allen, TX (US); Beatriz Blazquez, Richardson, TX (US)

(73) Assignee: CommScope Technologies LLC, Hickory, NC (US)

( * ) Notice: Subject to any disclaimer, the term of this patent is extended or adjusted under 35 U.S.C. 154(b) by 31 days.

(21) Appl. No.: 16/089,545

(22) PCT Filed: Apr. 5, 2017

(86) PCT No.: PCT/US2017/026044
§ 371 (c)(1),
(2) Date: Sep. 28, 2018

(87) PCT Pub. No.: WO2017/176822
PCT Pub. Date: Oct. 12, 2017

(65) Prior Publication Data
US 2019/0123412 A1 Apr. 25, 2019

Related U.S. Application Data

(60) Provisional application No. 62/319,484, filed on Apr. 7, 2016.

(51) Int. Cl.
*H01P 1/18* (2006.01)
*H01G 5/013* (2006.01)
*G01L 9/12* (2006.01)
*G02B 26/00* (2006.01)
*H03H 7/18* (2006.01)

(52) U.S. Cl.
CPC ............ *H01P 1/184* (2013.01); *G01L 9/12* (2013.01); *G02B 26/005* (2013.01); *H01G 5/0132* (2013.01); *H03H 7/18* (2013.01)

(58) Field of Classification Search
CPC .. H01P 1/184; H01P 1/18; H03H 7/18; G02B 26/005; G01L 9/12; H01G 5/0132
(Continued)

(56) References Cited

U.S. PATENT DOCUMENTS

2003/0012483 A1    1/2003    Ticknor et al.
2004/0098647 A1    5/2004    Pande et al.
(Continued)

FOREIGN PATENT DOCUMENTS

CN    2562497 Y    7/2003
CN    1883079 A    12/2006
(Continued)

OTHER PUBLICATIONS

Chinese Office Action corresponding to Chinese Application No. 201780029996.0 (16 pages) (dated Oct. 31, 2019).
(Continued)

*Primary Examiner* — Rakesh B Patel
*Assistant Examiner* — Jorge L Salazar, Jr.
(74) *Attorney, Agent, or Firm* — Myers Bigel, P.A.

(57) ABSTRACT

An adjustable phase shifter includes an RF signal input, an RF signal output, a first delay line, a second delay line and a first electrowetting-activated switch disposed between the RF signal input and the RF signal output.

23 Claims, 14 Drawing Sheets

(58) Field of Classification Search
USPC .............................. 333/24 R, 139, 156, 161
See application file for complete search history.

(56) References Cited

U.S. PATENT DOCUMENTS

| | | |
|---|---|---|
| 2004/0201330 A1 | 10/2004 | Fong et al. |
| 2006/0077762 A1 | 4/2006 | Boland et al. |
| 2008/0037197 A1 | 2/2008 | Casset |
| 2008/0180190 A1 | 7/2008 | Chan et al. |
| 2017/0033761 A1* | 2/2017 | Huang .................. H03H 7/0153 |
| 2018/0151953 A1* | 5/2018 | Yoshida .................. H01Q 3/36 |

FOREIGN PATENT DOCUMENTS

| | | |
|---|---|---|
| CN | 103684511 | 3/2014 |
| CN | 103715939 | 4/2014 |
| EP | 0377508 | 7/1990 |

OTHER PUBLICATIONS

Saeki et al. "Electrowetting on Dielectrics (EWOD): Reducing Voltage Requirements for Microfluidics", Polymeric Materials: Science and Engineering, 85:12-13 (2001).

Anaren, "90-Degree Hybrid Couplers" downloaded Sep. 20, 2018 from https://www.anaren.com/catalog/xinger/90-degree-hybrid-couplers, 7 pp.

International Search Report and Written Opinion of the International Searching Authority, International Application No. PCT/US2017/026044, dated Jun. 21, 2017, 18 pp.

Chinese Office Action corresponding to Chinese Application No. 201780029996.0 (21 pages) (dated Mar. 18, 2020).

"Droplet Based Fluid Handling" Bartels-Mikrotechnik (1 Page).

Phase Shifter schematic based on 90° Hybrid Coupler with 2 Variable Capacitors (1 page).

\* cited by examiner

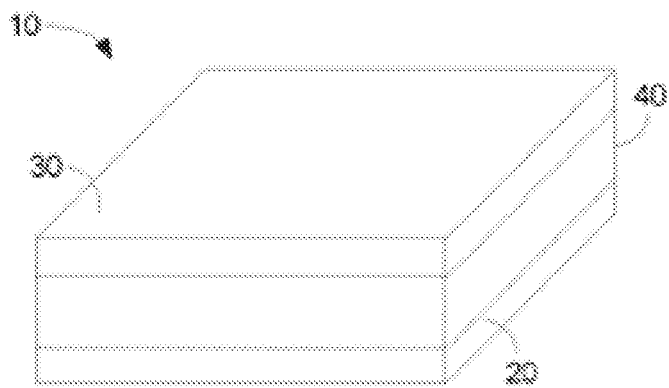
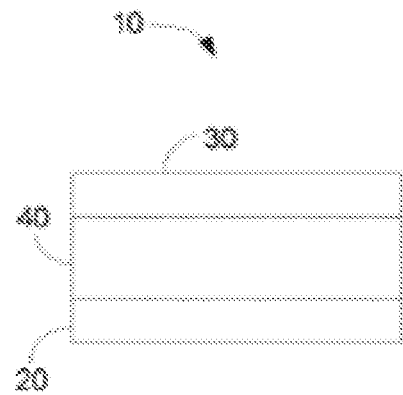
FIG. 1A
*(PRIOR ART)*
FIG. 1B
*(PRIOR ART)*
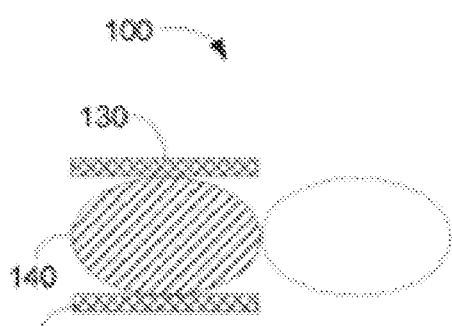
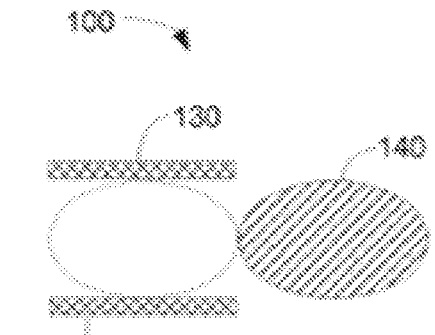
FIG. 2A
FIG. 2B
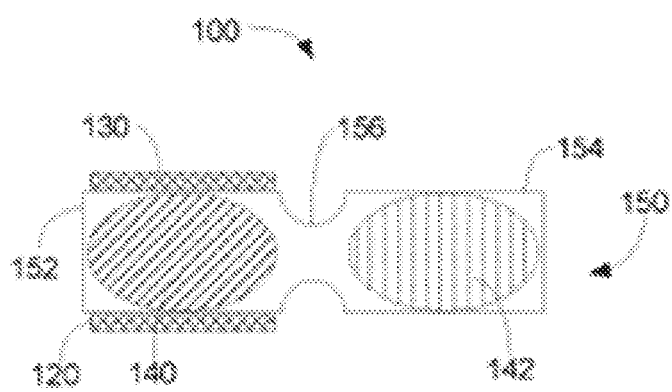
FIG. 2C

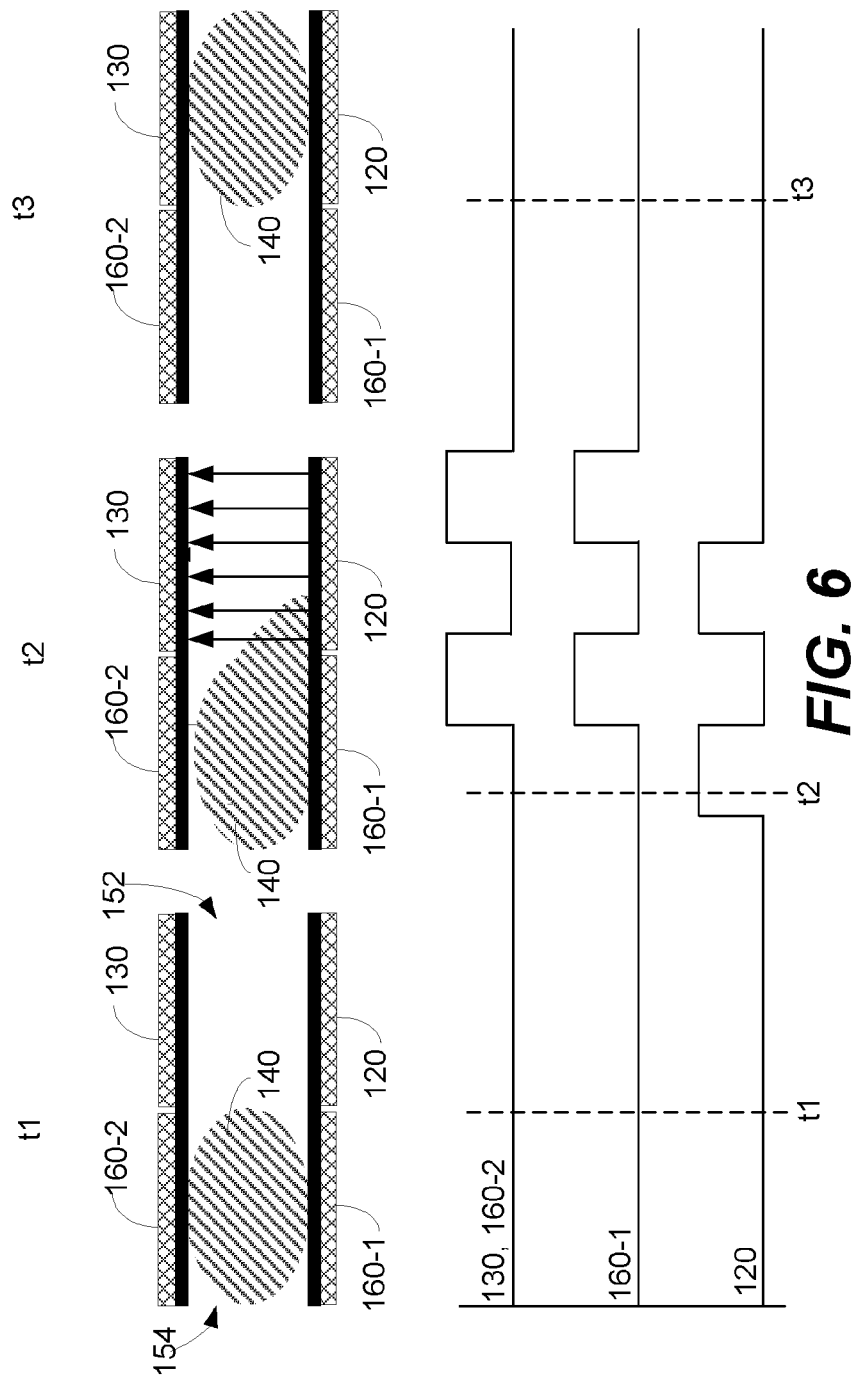

US 10,770,771 B2

VARIABLE CAPACITORS AND SWITCHES FABRICATED USING ELECTROWETTING ON DIELECTRIC TECHNIQUES AND RELATED PHASE SHIFTERS, BASE STATION ANTENNAS AND OTHER DEVICES

CROSS-REFERENCE TO RELATED APPLICATIONS

The present application is a 35 U.S.C. § 371 national stage application of PCT Application No. PCT/US2017/026044, filed on Apr. 5, 2017, which itself claims priority from and the benefit of U.S. Provisional Patent Application Ser. No. 62/319,484, filed Apr. 7, 2016, the entire contents of both of which are incorporated by reference herein as if set forth in their entireties. The above-referenced PCT Application was published in the English language as International Publication No. WO 2017/176822 A1 on Oct. 12, 2017.

BACKGROUND

Capacitors are a well known passive electronic circuit element that may be used to store an electric charge. A capacitor may comprise a pair of electrical conductors that are referred to as electrodes that are separated by a dielectric material (e.g., an insulator that can be polarized). Most typically, each electrode may be implemented as a flat plate-shaped structure, although other-shaped electrodes may be used (e.g., annular cylinder electrodes).

When a potential difference (V) is applied across the electrodes of a capacitor, an electric field develops across the dielectric material, causing positive charge to develop on one electrode and negative charge to develop on the other electrode. A capacitor is characterized by its capacitance (C), which is defined as the ratio of the electric charge on each electrode to the potential difference V between them. Capacitance is typically measured in farads.

One specialized type of capacitor that is known in the art is the variable capacitor. A variable capacitor has an adjustable capacitance value that may be intentionally and repeatedly changed. Variable capacitors may be adjusted by mechanical and electronic means.

BRIEF DESCRIPTION OF THE FIGURES

FIGS. 1A and 1B are a schematic perspective view and a side view, respectively, of a conventional capacitor.

FIGS. 2A and 2B are schematic side views of a variable capacitor according to embodiments of the present invention.

FIG. 2C is a schematic side view of an embodiment of the variable capacitor of FIGS. 2A-2B that illustrates how the liquid dielectric materials thereof may be stored in a container having a pair of chambers.

FIG. 6 is a schematic diagram illustrating how the capacitance of the variable capacitor of FIG. 5 may be changed.

DETAILED DESCRIPTION

Figure 3A:
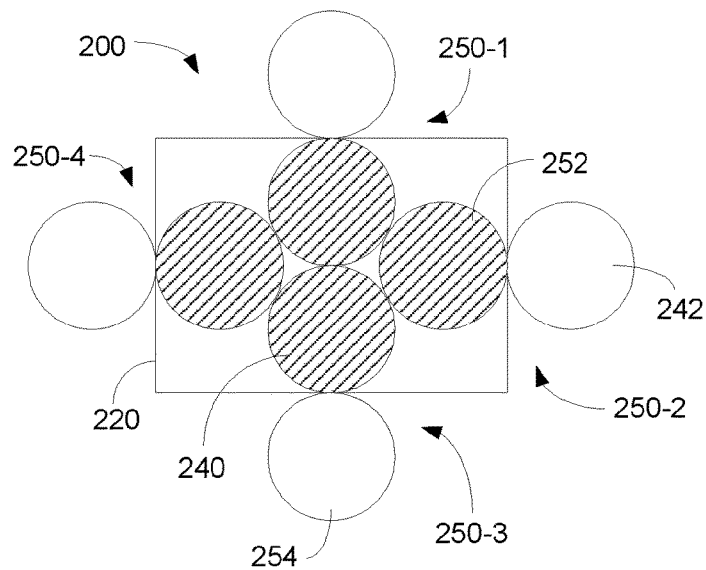
FIGS. 3A-3E are schematic plan views illustrating the different capacitance states of a variable capacitor according to further embodiments of the present invention.

Pursuant to embodiments of the present invention, variable capacitors are provided that may exhibit a number of advantages over conventional variable capacitors. The variable capacitors according to embodiments of the present invention may operate using electrowetting on dielectric techniques. In particular, the variable capacitors may include a pair of electrodes and an electrostatically moveable liquid dielectric material that may be selectively moved in and out of a space between the electrodes of the variable capacitor. In some embodiments, the electrostatically moveable liquid dielectric material may be a high dielectric constant material having a dielectric constant between for example, 10 and 150. When this electrostatically moveable liquid dielectric material is moved into the space between the electrodes, the variable capacitor may exhibit a high capacitance level. When the electrostatically moveable liquid dielectric material is moved out from the space between the electrodes, it may be replaced with a lower dielectric constant material such as, for example, a liquid or gas having a low dielectric constant. In this state, the variable capacitor may exhibit a low capacitance level.

The variable capacitors according to embodiments of the present invention may be designed to have a large number of different capacitance states, if necessary for a particular application. In some embodiments, this may be accomplished by forming the variable capacitor using a large number of small "unit cell" variable capacitors. With this approach, the capacitance can be set to a desired value by setting the appropriate number of the unit cell variable capacitors into their high capacitance state. In other embodiments, the amount of the high dielectric constant liquid that is interposed between the electrodes of the capacitor may be varied on a granular basis so that a single variable capacitor may exhibit more than two (and potentially a large number) of capacitance states.

The variable capacitors according to embodiments of the present invention may be small and lightweight while providing a wide range of capacitance values. Moreover, in some embodiments, the only moving parts in these variable capacitors are drops of liquid that are moved small distances within sealed chambers, and hence the variable capacitors may exhibit high levels or reliability and are essentially solid state capacitors. The variable capacitors also do not have non-linear electrical junctions or materials that can give rise to passive intermodulation ("PIM") distortion, which is a known form of electrical interference that may arise in RF circuits. Thus, the variable capacitors according to embodiments of the present invention may be well-suited for use in RF transmission systems.

Pursuant to further embodiments of the present invention electrowetting-activated switches are provided that use electrowetting techniques to selectively make and break an electrical connection between an input and an output of the switch. These switches may use electrowetting techniques to move a droplet of liquid metal to open or close the switch. The switches may be designed to make direct ohmic electrical connections or capacitive connections when closed.

The variable capacitors and electrowetting-activated switches disclosed herein may be used in a wide variety of applications including, for example, in adjustable phase shifters. For many applications within wireless telecommunications, including various base station antenna applications, there is a demand for adjustable phase shifters that are capable of passing a high power (e.g., 60 watt) modulated carrier while exhibiting low levels of PIM distortion (e.g., better than −165 dBc) and low insertion loss (e.g., 0.3 dB or less). In addition, such a phase shifter would need to be electrically controlled and have passive latching such that the phase state remains unchanged whenever power or control are removed. Unfortunately, existing semiconductor switch based phase shifters are typically unable to meet at least the stringent PIM distortion requirements. The phase shifters according to embodiments of the present invention are expected to be able to achieve such performance levels.

Aspects of the present invention will now be described in greater detail with reference to the figures, in which embodiments of the present invention are shown.

FIGS. 1A and 1B are a schematic perspective view and a side view, respectively, of a conventional capacitor 10. As shown in FIGS. 1A-1B, the capacitor 10 includes a lower electrode 20, an upper electrode 30 and a dielectric layer 40 that is interposed therebetween. The capacitance (C) of the capacitor 10 may be expressed as follows:

$$C=\varepsilon *A/d \tag{1}$$

where:
  ε=the absolute permittivity of the dielectric layer 40;
  A=the area that the electrodes 20, 30 overlap in square meters; and
  d=the distance between the electrodes 20, 30 in meters.

The capacitance C of the capacitor 10 may be changed by (1) changing the permittivity of the dielectric layer 40, (2) changing the area of overlap of the electrodes 20, 30 (e.g., by using electrodes having larger or smaller surface area) and/or (3) changing the distance between the electrodes 20, 30. Pursuant to embodiments of the present invention, variable capacitors are provided in which the permittivity of the dielectric layer may be changed in order to vary the capacitance, as will be discussed in detail below.

FIGS. 2A and 2B are schematic side views of a variable capacitor 100 according to embodiments of the present invention. FIG. 2C is a schematic side view of an embodiment of the variable capacitor 100 of FIGS. 2A-2B that illustrates how the dielectric materials thereof may be stored in a container having a pair of chambers.

As shown in FIGS. 2A-2B, the variable capacitor 100 includes a lower electrode 120, an upper electrode 130 and a dielectric material 140. The dielectric material 140 may comprise a liquid dielectric material 140 having, for example, a relatively high dielectric constant. The liquid dielectric material 140 may be moved to be in at least one of two positions. As shown in FIG. 2A, in the first position the liquid dielectric material 140 is in the space between the two electrodes 120, 130. This first position may correspond to a high capacitance state. As shown in FIG. 2B, in the second position the liquid dielectric material 140 is moved out the space between the two electrodes 120, 130. This second position may correspond to a low capacitance state.

In some embodiments, when the liquid dielectric material 140 is moved to the second position, air (or another gas) may take its place to fill the space between the electrodes 120, 130. In other embodiments, first and second dielectric materials 140, 142 may be provided that change positions. For example, as shown in FIG. 2C, in some embodiments, the capacitor 100 may further include an hourglass-shaped container 150 that has a first chamber 152, a second chamber 154, and a neck region 156. The first liquid dielectric material 140 may be contained in, for example, the first chamber 152, and the second dielectric material 142 may be contained in the second chamber 154. The second dielectric material 142 may comprise, for example, a gas (e.g., air) or a liquid dielectric material that has a dielectric constant that is different from the dielectric constant of the first liquid dielectric material 140.

The first liquid dielectric material 140 may be moved using electrowetting on dielectric techniques. Electrowetting refers to a process whereby the wetting properties of a surface (typically a hydrophobic surface) are modified by an applied electric field. For example, a droplet of electrostatic liquid (for instance, ethanol or methanol) may be placed on a surface such as, for example, an insulating layer (hence the label "electrowetting on dielectric"). An electric field is applied across the drop of liquid. In response to the applied electric field, electric charge accumulates at the interface between the drop of liquid and the insulating layer. The fringing electric field at the corners of the conductive droplet tend to pull the droplet down onto the insulating layer, changing the contact angle between the droplet and the insulating surface from more hydrophobic to more hydrophilic. By appropriate arrangement of the electrodes and application of the electric field, the droplet may be made to move. Thus, the first liquid dielectric material 140 may be referred to herein as an electrostatically moveable liquid dielectric material.

In some embodiments, the above-described electrowetting techniques may be used to move the first liquid dielectric material 140 between the first chamber 152 and the second chamber 154. As the first liquid dielectric material 140 moves from, for example, the first chamber 152 to the second chamber 154 it may force some or all of the second dielectric material 142 from the second chamber 154 to the first chamber 152. As the first and second liquid dielectric materials 140, 142 have different dielectric constants, the capacitor 100 may have two different capacitances, namely a first capacitance C1 when the first (e.g., high dielectric constant) liquid dielectric material 140 fills the space between the electrodes 120, 130, and a second (lower) capacitance C2 when the second (e.g., lower dielectric constant) dielectric material 142 is in the space between the electrodes 120, 130. Thus, the capacitor 100 may comprise a variable capacitor that has a capacitance that may be changed using electrowetting principles to change the dielectric material that is interposed between the electrodes 120, 130.

As noted above, in some embodiments, the dielectric material 142 may comprise a liquid dielectric material. The liquid dielectric material 142 may be a slippery material in some embodiments. The liquid dielectric materials 140, 142 may comprise liquids that have low solubility levels so that the liquids 140, 142 will not readily mix as they exchange positions within the container 150. For some applications, the liquid dielectric materials 140, 142 may have a low melting point and a high boiling point so that the materials will remain in liquid form in outdoor locations in both the winter and summer. In some embodiments, low density and viscosity levels may be desirable so that the liquid materials 140, 142 may be more quickly switched from one chamber 152, 154 to the other.

The first liquid dielectric material 140 may have a high dielectric constant in some embodiments. TABLE I below lists some possible high dielectric constant liquid dielectric materials that are electrostatically moveable materials. As shown in TABLE I, suitable materials having dielectric constants ranging from less than 20 to almost 200 are available. TABLE I also provides data regarding various fluid mechanics and thermodynamic characteristics of the example electrostatically moveable liquid dielectric materials.

TABLE I

| Liquid | Dielectric Constant | Density (g/cm3) | Viscosity (mPa * s) | Melting Point (C) | Boiling Point (C) |
|---|---|---|---|---|---|
| Propylene Carbonate | 65 | 1.198 | 25 | −55 | 240 |
| γ-butyrolactone | 42 | 1.13 | 1.7 | −43 | 204 |
| DMSO | 41 | 1.1 | 1.996 | 19 | 189 |
| Propionitrile | 28 | 0.772 | | −93 | 97 |
| 2-propanol | 18 | 0.785 | | −90 | 82 |
| N-methylacetamide | 179 | 0.957 | | 27 | 205 |
| Acetonitrille | 38 | 0.7857 | 0.316 | −45 | 82 |
| Ethanol | 24 | 0.789 | | −114 | 78 |
| Propylene Glycol | 32 | 1.04 | 48.6 | −60 | 188 |
| N-methylformamide | 171 | 1.011 | | −4 | 199 |
| Methaonl | 30 | 0.791 | | −98 | 65 |
| Ethylene Glycol | 37 | 1.1132 | 16.1 | −13 | 197 |
| Glycerol | 43 | 1.25 | | 20 | 182 |
| Hydroxy Propylene Carbonate | 110 | 1.4 | | −69 | |
| Formamide | 109 | 1.133 | 3.75 | 3 | 211 |

While in the above description the first liquid dielectric material 140 that has a high dielectric constant is the electrostatically moveable liquid, it will be appreciated that in other embodiments the second low dielectric constant liquid dielectric material 142 may be the electrostatically moveable liquid. In such embodiments, the second low dielectric constant liquid dielectric material 142 may be electrostatically moved so that it will displace the first high dielectric constant liquid dielectric material, thereby moving it between the first and second containers 152, 154. Additionally, while herein reference is made to electrostatically moving a "droplet" of liquid for convenience of description, it will be appreciated that more than a single droplet of liquid may be electrostatically moved in the variable capacitors according to embodiments of the present invention, either by moving a larger quantity of liquid dielectric material by electrowetting techniques or by simultaneously moving multiple different droplets. An example of the second of these approaches will now be described with reference to FIGS. 3A-3E.

In particular, FIGS. 3A-3E are schematic plan views of a variable capacitor 200 according to further embodiments of the present invention. The variable capacitor 100 described above may have two different capacitance states, depending upon which dielectric material 140, 142 is interposed in the space between the electrodes 120, 130. In other embodiments, more than a single droplet of high dielectric constant liquid dielectric material may be used to provide a variable capacitor having more than two states. For example, the capacitor 200 may include four hourglass shaped containers 250-1 through 250-4 (collectively, 250) each of which has a first chamber 252 and a second chamber 254 that are connected by a passage such as a neck region (not explicitly shown). The containers 250 may be arranged so that each first chamber 252 may be a central chamber 252 that is in the space between the electrodes 220, 230 (the top electrode 230 is not shown in FIGS. 3A-3E so that the positions of the dielectric materials can be seen) and each second chamber 254 may be a peripheral chamber 254 that is not in the space between the electrodes 220, 230. Each container 250 may include a droplet of a first electrostatically moveable liquid dielectric material 240 in one of the two chambers 252, 254 and, for example, a second droplet of liquid dielectric material 242 that has a lower dielectric constant in the other of the two chambers 252, 254.

Figure 3B:
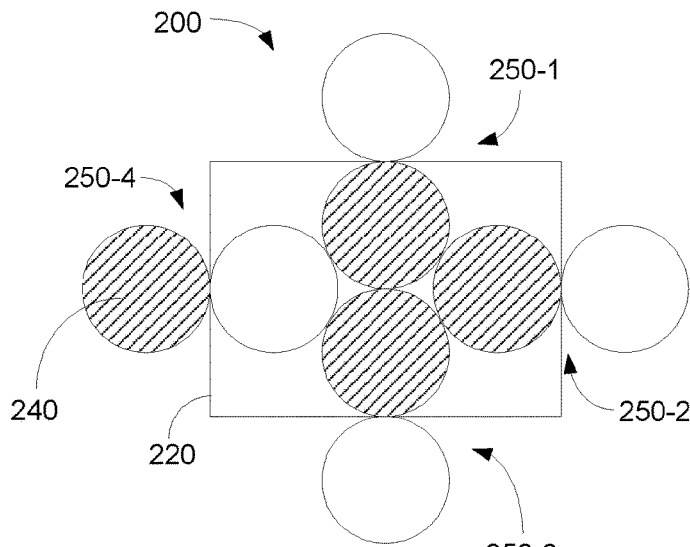
Figure 3C:
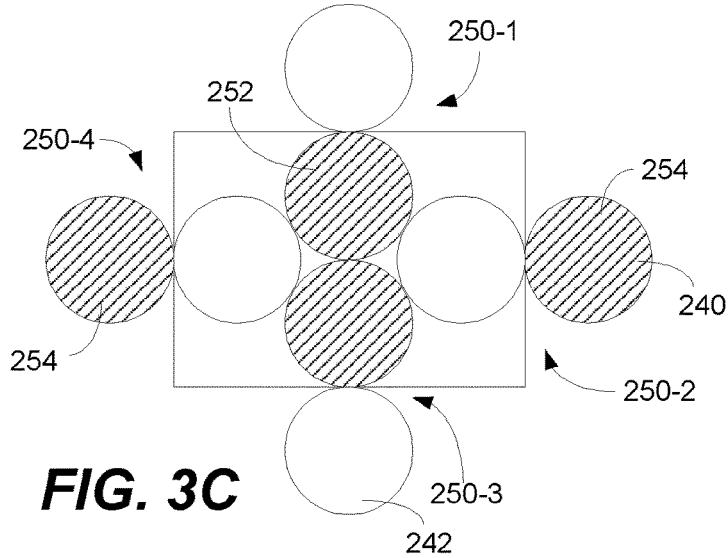
Figure 3D:
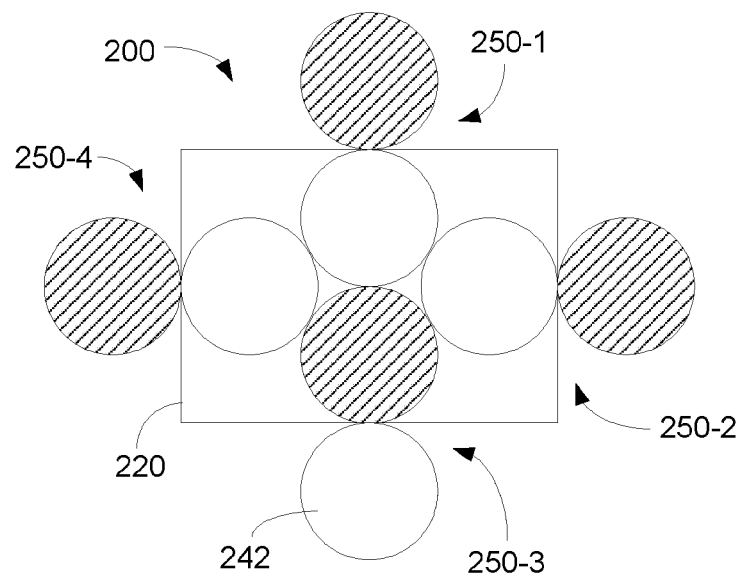
Figure 3E:
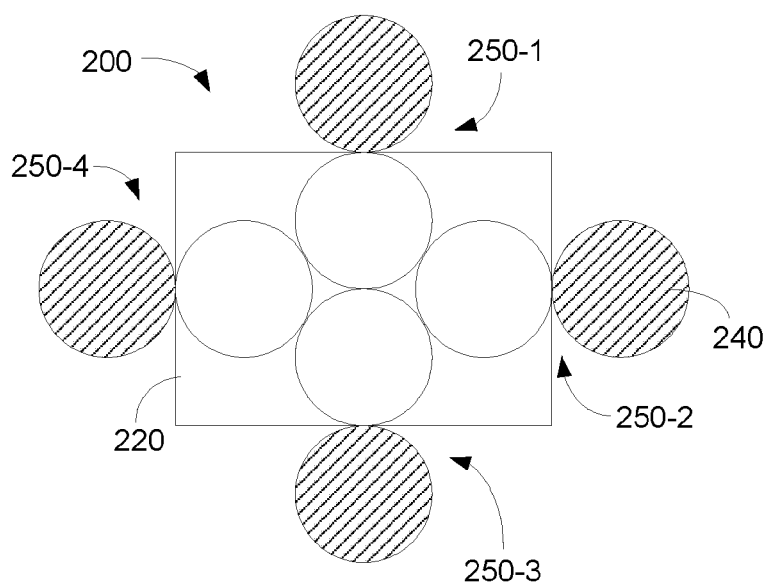

As shown in FIGS. 3A-3E, the capacitance of the variable capacitor 200 may be changed between one of five different states by moving the first electrostatically moveable liquid dielectric material 240 included in each of the four containers 250-1 through 250-4 (collectively the containers 250) between the central and peripheral chambers 252, 254. In the example of FIG. 3A, the first electrostatically moveable liquid dielectric material 240 is controlled to be in each of the central chambers 252, which will provide a maximum amount of capacitance. In the example of FIG. 3B, the first electrostatically moveable liquid dielectric material 240 is controlled to be in the central chambers 252 of the first through third containers 250-1 through 250-3 while the lower dielectric constant second dielectric material 242 is in the central chamber 252 of the fourth container 250-4 and the first electrostatically moveable liquid dielectric material 240 is in the peripheral chamber 254 of the fourth container 250-4. This will provide a somewhat lower level of capacitance as compared to when the capacitor 200 is in the state illustrated in FIG. 3A. FIGS. 3C-3E show the remaining three states for the variable capacitor, each of which provides increasingly less capacitance.

It will be appreciated that numerous modifications may be made to the above-described variable capacitors 100, 200. For example, in other embodiments, one or more droplets of an electrostatically moveable liquid may be moved gradually into the area between a pair of electrodes. For example, a droplet may be moved so that 0%, 20%, 40%, 60%, 80% or 100% of the droplet is between the pair of electrodes while the remaining portion (if any) of the droplet is not between the pair of electrodes. In this fashion, a variable capacitor may be provided that has six distinct capacitance states by electrostatically moving a single droplet (or other quantity) of a liquid dielectric material. The different amounts of the droplet (or droplets) may be controlled to be between the electrodes may be changed to provide a variable capacitor having any desired number of capacitance states, and/or more than a single quantity of liquid dielectric material may be moved between the electrodes in this fashion.

In other embodiments, the four central chambers 252 of the variable capacitor 200 may be replaced, for example, with a single, larger central chamber. In such an embodiment, four droplets (or other quantities) of liquid dielectric material may be selectively electrostatically moved between the four peripheral chambers 254 and this larger central chamber. Additionally, as noted above, in still other embodiments, the second dielectric material 142, 242 may comprise an electrostatically moveable liquid that has a low dielectric constant. In such embodiments, the first liquid dielectric material 140, 240 may comprise a non-electrostatically moveable liquid that has a high dielectric constant. In yet another embodiment, each droplet may have a different dielectric constant. It will likewise be appreciated that the size, shape and number of containers 150 may be changed. The container 150 may be omitted altogether in some embodiments. Thus, it will be appreciated that the above embodiments are exemplary in nature and are not to be construed as limiting to the scope of the present invention.

Figure 4:
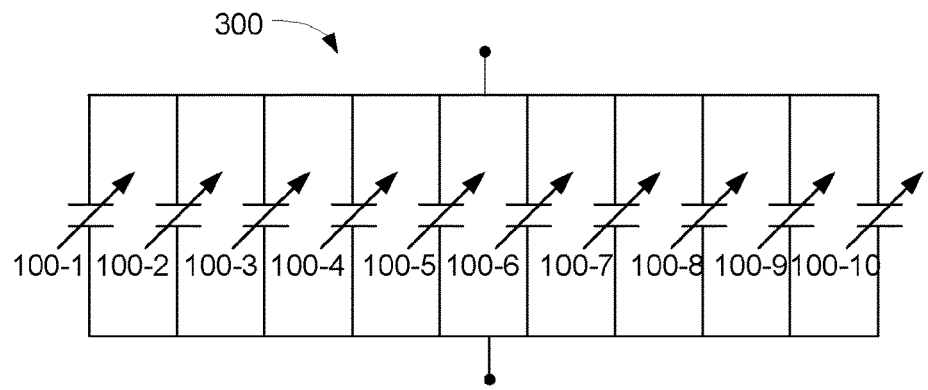
FIG. 4 is a schematic circuit diagram illustrating how a plurality of the variable capacitors of FIGS. 2A-2C may be used to form a composite variable capacitor that has a large number of different capacitance states.

It will also be appreciated that the variable capacitors according to some embodiments of the present invention may have a unit cell structure and that this unit cell structure may be used to increase the number of different capacitance states. For example, FIG. 4 is a schematic circuit diagram illustrating how a plurality of the variable capacitors 100 of FIGS. 2A-2C may be used to form a composite variable capacitor 300 that has a large number of different capacitance states. As shown in FIG. 4, the variable capacitor 300 includes a plurality of the variable capacitors 100 that are arranged in parallel. In the example of FIG. 4, a total of ten capacitors 100 are provided that are individually labeled 100-1 through 100-10 in FIG. 4. Each capacitor 100 may be independently controlled to be in one of the two states, namely a high capacitance state or a low capacitance state. Thus, the capacitor 100 may have eleven different capacitance values depending upon the number of the capacitors 100 that are in the high capacitance state. The number of unit cell capacitors included in the variable capacitor 300 may be modified as appropriate to provide a capacitor having an appropriate range of capacitance values and an appropriate number of different states between the upper and lower capacitance values in this range. It will also be appreciated that some of the capacitors 100 may have different designs or characteristics.

It will also be appreciated that various techniques may be used to increase the number of unique capacitance states without unduly increasing the number of unit cell variable capacitors 100 included in the composite variable capacitor 300. For example, in further embodiments, different first electrostatically movable liquid dielectric materials 140 may be used in different of the unit cell capacitors 100. If, for example, unit cell capacitors 100-1 and 100-2 include a first electrostatically movable liquid dielectric material 140-1 that has a dielectric constant of, for example, 4, unit cell capacitors 100-3 and 100-4 include a first electrostatically movable liquid dielectric material 140-2 that has a dielectric constant of, for example, 10, unit cell capacitors 100-5 and 100-6 include a first electrostatically movable liquid dielectric material 140-3 that has a dielectric constant of, for example, 22, unit cell capacitors 100-7 and 100-8 include a first electrostatically movable liquid dielectric material 140-4 that has a dielectric constant of, for example, 39, and unit cell capacitors 100-9 and 100-10 include a first electrostatically movable liquid dielectric material 140-5 that has a dielectric constant of, for example, 74, the capacitor may exhibit a very broad range of capacitance values and may be set to large number of different setting within the range. Similar effects may be achieved, for example, by (1) changing the area that the electrodes 120, 130 overlap for different of the unit cell capacitors 100, (2) changing the distance between the electrodes 120, 130 for different of the unit cell capacitors 100, (3) changing the amount that the first electrostatically movable liquid dielectric material 140 is interposed between the electrodes in the high capacitance state for different of the unit cell capacitors 100, etc.

Figure 5A:
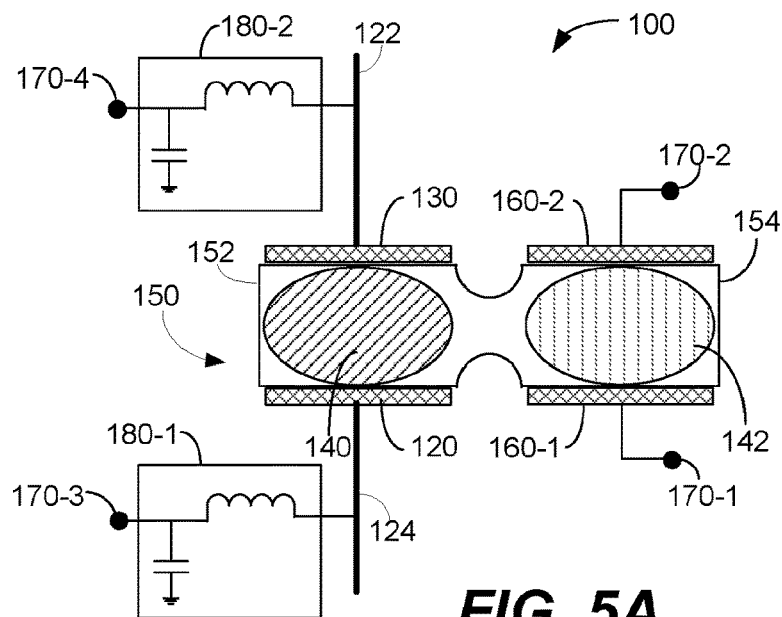
FIG. 5A is a schematic side view of the variable capacitor of FIGS. 2A-2C that further illustrates the control circuitry thereof.

FIG. 5A is another schematic side view of the variable capacitor 100 of FIGS. 2A-2C that illustrates example control circuitry thereof. As shown in FIG. 5A, the container 150 is disposed horizontally with the first electrostatically moveable liquid dielectric material 140 contained in the first chamber 152 and the second liquid dielectric material 142 contained in the second chamber 154. The lower and upper electrodes 120, 130 of the capacitor 100 are disposed on either side of the first chamber 152. A first conductive line 122 may be connected to the lower electrode 120 and a second conductive line 132 may be connected to the upper electrode 130. The conductive lines 122, 124 may comprise, for example, RF transmission lines. A lower control electrode 160-1 and an upper control electrode 160-2 may be provided below and above the second chamber 154, respectively. At least one of the lower and upper control electrodes 160-1, 160-2 may be coupled to a control voltage source. In the depicted embodiment, the lower and upper control electrodes 160-1, 160-2 are connected to respective first and second DC control voltage sources 170-1, 170-2. Third and fourth control voltage sources 170-3, 170-4 are electrically connected to the respective lower and upper electrodes 120, 130. Low pass bias filters 180-1, 180-2 may also be provided in some embodiments that allow the electrode to be used for both the RF electrode of the capacitor and the electrode for influencing the movement of the droplets of electrostatically moveable liquid dielectric material 140. The filters 180-1, 180-2 allow a low frequency or DC bias voltage to be applied without interfering with the RF signal and the RF signal is not lost in the DC circuits.

FIG. 6 is a schematic diagram illustrating how the variable capacitor 100 of FIG. 5A may be operated. The upper portion of FIG. 6 shows the location of the first electrostatically moveable liquid dielectric material 140 (which is the high dielectric constant material in this example) at three consecutive moments in time labeled t1-t3 in FIG. 6. The lower portion of FIG. 6 is a series of graphs that illustrate the DC voltages that are applied to the lower and upper electrodes 120, 130 and to the control electrodes 160-1, 160-2 over time, and these graphs include the moments in time t1-t3.

As shown in the left-hand portion of FIG. 6, initially the first electrostatically moveable liquid dielectric material 140 is located in the second chamber 154 of container 150, which is the container that is not in the space between the electrodes 120, 130. In this example, the first electrostatically moveable liquid dielectric material 140 is a high dielectric constant material and a second dielectric material—which in this case may be air—is located in the first chamber 152 of container 150. Since air has a low dielectric constant, the variable capacitor 100 is in a low capacitance state when the first and second dielectric materials are in the respective positions shown on the left-hand side of FIG. 6.

As shown in the central portion of FIG. 6, at some point in time after time t1 a series of control voltages are supplied from the control voltage sources 170-1 through 170-4 to the respective electrodes 120, 130, 160-1, 160-2. These control voltages may be applied in a manner that causes the droplet of the first electrostatically moveable liquid dielectric material 140 to start to move from the second chamber 154 through the neck region 156 (see FIG. 2C) and into the first chamber 152. As the first electrostatically moveable liquid dielectric material 140 moves, the second dielectric material 142 is displaced from the first chamber 152 and moves through the neck region 156 into the second chamber 154. In this fashion, selective application of control voltages to the electrodes 120, 130, 160-1, 160-2 may cause the first electrostatically moveable liquid dielectric material 140 to move from the second chamber 154 (see time t1 in FIG. 6) to the first chamber 152 (see time t3 in FIG. 6). Applying the control voltages in, for example, the reverse order to what is shown in FIG. 6 may cause the first electrostatically moveable liquid dielectric material 140 to move from the first chamber 152 to the second chamber 154. Thus, it will be appreciated that by simple application of one or more control voltages to various electrodes of the variable capacitor 100, the capacitor 100 may be switched between a low capacitance state and a high capacitance state and vice versa. Moreover, while the first electrostatically moveable liquid dielectric material 140 may be readily made to move between the first and second containers 152, 154 by application of control voltages, once the control voltages are removed the first electrostatically moveable liquid dielectric material 140 may remain stationary and hence will not move between the chambers 152, 154 until additional control voltages are applied. In other words, the variable capacitors according to embodiments of the present invention may hold a given capacitance state without application of a continuous voltage. Most other variable capacitors require a DC bias voltage to hold a particular capacitance state.

While in the above described embodiment control voltages are applied to all four electrodes 120, 130, 160-1, 160-2, it will be appreciated that the control voltages may be applied to fewer electrodes in other embodiments. For example, in some embodiments, the electrodes 160-1, 160-2 may be omitted and a control potential may only be applied across the electrodes 120, 130. A control voltage having a first polarity (e.g., a positive voltage) may be used, for example, to repel the first electrostatically moveable liquid dielectric material 140 when it is in the first chamber 152, forcing the first electrostatically moveable liquid dielectric material 140 into the second chamber 154. A control voltage having a second polarity (e.g., a negative voltage) may be used, for example, to attract the first electrostatically moveable liquid dielectric material 140 when it is in the second chamber 154 to pull the material 140 back into the first chamber 152. Similarly, in other embodiments the control voltage may only be provided across the electrodes 160-1, 160-2 to attract the first electrostatically moveable liquid dielectric material to, or repel the first liquid dielectric material 140 from, the second chamber 154.

Figure 5B:
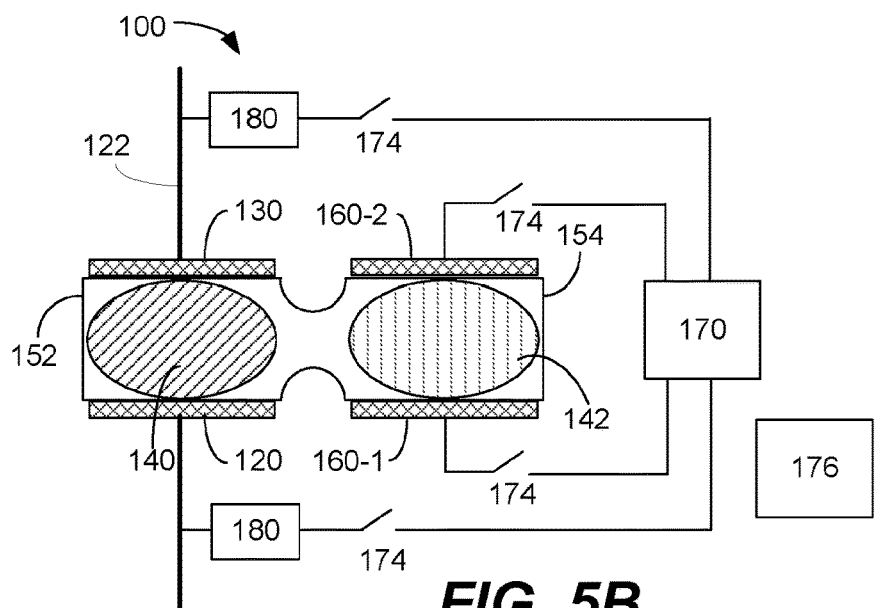
FIG. 5B is a schematic side view of the variable capacitor of FIGS. 2A-2C that illustrates an alternative implementation of the control circuitry thereof.

It will be appreciated that fewer control voltage sources 170 may be used in other embodiments. For example, in some embodiments, a single control voltage source 170 may be used. For example, FIG. 5B illustrates another example control circuit implementation for the variable capacitor 100 instead of the implementation illustrated in FIG. 5A. As shown in FIG. 5B, a control voltage source 170 outputs a control voltage to each of a plurality of output ports 172 thereof. The control voltage source 170 may comprise, for example a direct current (DC) voltage regulator circuit that outputs a constant DC voltage (e.g., 40 volts). Each output port 172 is connected by a control line to a respective one of the electrodes 120, 130, 160-1, 160-2. A switch 174 may be interposed between each output port 172 and the respective one of the electrodes 120, 130, 160-1, 160-2 to which the output port 172 is connected. The switches 174 may comprise, for example, power MOSFET transistors. A controller 176 may be provided that has a plurality of output ports (not shown to simplify the drawing) that are electrically connected to the control terminals of the respective switches 174 (e.g., to the gate electrodes when the switches 174 are implemented as MOSFET transistors). The controller 176 may control the switches 174 to selectively apply the control voltage to the electrodes 120, 130, 160-1, 160-2 in the manner discussed above with reference to FIG. 6 in order to switch the variable capacitor 100 back and forth between its high and low capacitance states.

While in the above description, the control voltage source 170 outputs a DC control voltage, embodiments of the present invention are not limited thereto. For example, in other embodiments, a low frequency alternating current (AC) signal may be used as the control voltage.

Figure 11:
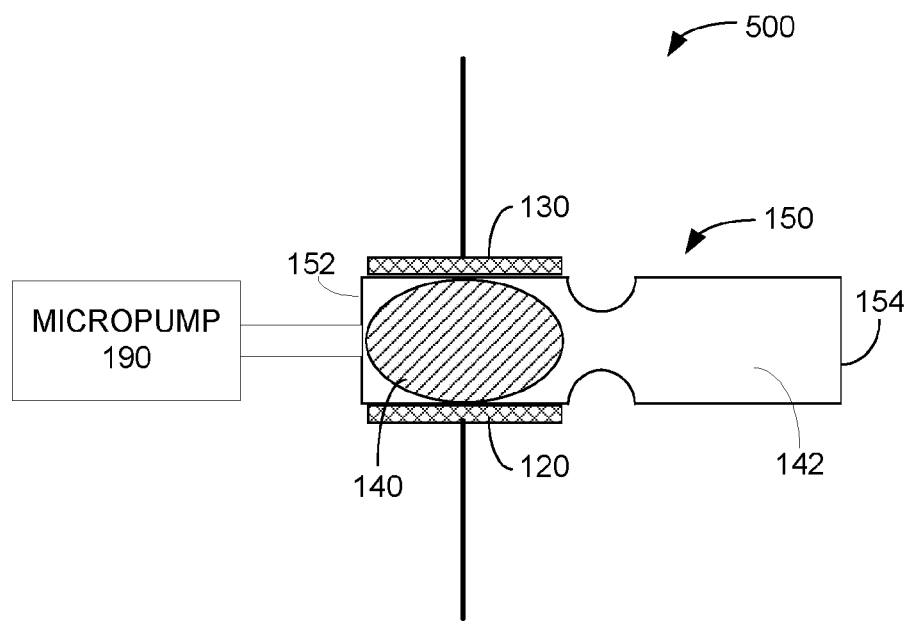
FIG. 11 is a schematic diagram of a variable capacitor according to further embodiments of the present invention that uses an electrowetting on dielectric micropump.

Electrowetting on dielectric principles have also been used to commercially realize micropumps, such as the Bartels micropumps available from Microtechnik. Such commercial micropumps may be used to move a high dielectric constant liquid material in and out from between two electrodes to provide a variable capacitor according to further embodiments of the present invention. FIG. 11 schematically illustrates a variable capacitor 500 according to embodiments of the present invention that operates in this manner by using an electrowetting micropump 190 to move a high dielectric constant material 140 between the first chamber 152 and the second chamber 154 of the container 150. It will be appreciated that in this embodiment neither the first liquid dielectric material 140 (which may be a high dielectric constant material) nor the second dielectric material 142 need be an electrostatically moveable material.

In some embodiments, a single variable capacitor 100 (or, alternatively a single variable capacitor 200 or a single one of any of the variants of capacitors that are discussed herein) may be used as a variable capacitor in an electronic circuit. As noted above, in some embodiments, a plurality of the variable capacitors may be used such as in the above-described application where a plurality of variable capacitors 100 are used as the unit cells of a larger composite variable capacitor 300 (see FIG. 4 and the description thereof). These individual and/or composite variable capacitors may be used in a wide variety of different electronic circuits. Two such applications will be discussed below by way of example only, namely adjustable phase shifters and tunable filters, both of which may be used, for example, in base station antennas for cellular communications systems. It will be appreciated, however, that the variable capacitors disclosed herein may be used in a wide variety of other types of electronic circuits and that the present application covers the use of the variable capacitors disclosed herein in all such circuits.

As noted above, pursuant to further embodiments of the present invention, phase shifters may be provided that are implemented using the above-described variable capacitors according to embodiments of the present invention. These phase shifters may suitable for use in, for example, base station antennas.

By way of background, base station antennas for cellular communications systems typically comprise one or more arrays of radiating elements such as dipoles that are mounted on, for example, a flat panel. Each array of radiating elements may produce an antenna beam that has desired characteristics such as, for example, a desired beam elevation angle, beam azimuth angle, and/or half power beam width in order to provide cellular service to a specified coverage air. A signal that is to be transmitted by such a base station antenna is divided into multiple sub-components, and each sub-component may be fed through an antenna feed network to a respective one of the radiating elements.

Based on network coverage requirements, cellular operators may find it advantageous to adjust the vertical elevation angle (i.e., the vertical angle of the antenna with respect to the horizon) or "tilt" of the main beam of a base station antenna in order to change the coverage area of the antenna. Such adjustment is typically referred to as "down-tilting" as the base station antenna is typically tilted to point at an elevation angle of 0° or less with respect to the horizon such as, for example, an elevation angle of 0° to −10°. It will be appreciated, however, that in some cases "down-tilting" will involve increasing the elevation angle, either from a first negative angle to a smaller negative angle or even to a positive elevation angle as may occur, for example, in metrocell systems where base station antennas may sometimes have positive elevation angles in order to provide enhanced coverage and service to nearby buildings. The base station antenna may be electronically down-tilted by controlling the phases of the sub-components of a signal that are transmitted through each radiating element of the array in a manner that changes the elevation angle of the main antenna beam. Such electronic down-tilt is typically performed by transmitting a control signal from a remote location to the base station antenna. In response to this control signal, the base station antenna adjusts settings of adjustable phase shifters that are included in the antenna feed network to implement the phase shifts.

Conventionally, electromechanical phase shifters have been used to electronically down-tilt the radiation pattern of a base station phased array antenna. An example of a conventional electromechanical phase shifter that is suitable for use in implementing remote electronic downtilt in a base station antenna is the wiper are phase shifter disclosed in U.S. Pat. No. 7,463,190. The phase shifter of the '190 patent has a stationary "main" printed circuit board and a mechanically rotatable "wiper" printed circuit board mounted thereon. The main printed circuit board has an input, a relatively large number (e.g., five, seven or nine) of outputs, and a plurality of arced transmission paths that connect to the respective outputs. The arced transmission paths have different radii and hence each arced path has a different length. An RF signal that is input at the input port is split and at least some of the sub-components thereof are transferred to the wiper printed circuit board, where they capacitively couple onto the respective arced transmission paths on the main printed circuit board. In this fashion, each output of the phase shifter may be coupled to an RF transmission path that has a different length. This change in path length adjusts the phase, and hence the phase shifter may apply a linear phase taper to the sub-components of the input RF signal. Moreover, the amount of the phase taper may be changed by mechanically adjusting the position where the wiper printed circuit board capacitively couples along the arced transmission paths on the main printed circuit board. For example, a five output phase shifter may be designed to (relatively) increase the phase at first and second outputs thereof by X° and 2X°, decrease the phase at fourth and fifth outputs thereof by −X° and −2X° and not adjust the phase at the third output thereof. Each of the five outputs of this example phase shifter would then be connected to a respective one of the radiating elements or to a respective sub-groups of radiating elements. As noted above, the amount of phase shift (i.e., "X") applied to each sub-component of the input RF signal may be adjusted by mechanically moving the wiper printed circuit board in order to adjust the lengths of the different transmission paths.

Unfortunately, conventional electro-mechanical wiper are phase shifters have a number of potential disadvantages. These phase shifters tend to be large in size, as the lengths that the RF transmission paths must be increased at the frequencies used in cellular communications systems are not insubstantial. Thus, the size and weight of the phase shifters may contribute in a meaningful way to the overall size and weight of the antenna, and these phase shifters may be expensive to fabricate. Additionally, the phase shifters require separate motors, mechanical linkages and motor controllers that are used to physically move the wiper printed circuit boards. These additional components further add to the size and weight of the base station antenna. Also, beam tilt time change may be slow, such as on the order of tens of seconds. Moreover, these mechanically moving parts are potential points of failure, particularly as the base station antennas are located outdoors in relatively harsh environments. Additionally, RF connections must be made to the input and outputs of each phase shifter. These connections are typically made by soldering coaxial cables to each input and output port of each phase shifter. This may require a large number of soldered connections, which increase manufacturing time and costs, and which also increases the testing time for the antenna as each soldered connection is typically tested to ensure that a good mechanical and electrical connection has been made.

Additionally, each soldered connection is a potential source for PIM distortion. As noted above, PIM distortion is a form of electrical interference that may occur when two or more RF signals encounter non-linear electrical junctions or materials along an RF transmission path. Inconsistent metal-to-metal contacts along an RF transmission path are one potential source for PIM distortion, particularly when such inconsistent contacts are in high current density regions of the RF transmission path. The non-linearities that arise may act like a mixer causing new RF signals to be generated at mathematical combinations of the original RF signals. If the newly generated RF signals fall within the bandwidth of the receiver, the noise level experienced by the receiver is effectively increased. When the noise level is increased, it may be necessary reduce the data rate and/or the quality of service. PIM distortion can be an important interconnection quality characteristic for an RF communications system, as PIM distortion generated by a single low quality interconnection may degrade the electrical performance of the entire RF communications system. Moreover, the PIM distortion may not arise immediately (where it can be relatively easily corrected) but may instead arise after the base station antenna has been installed on top of a tower in response to mechanical stress (e.g., from vibrations) and/or corrosion. Such PIM distortion can degrade the RF performance of the antenna and may require a costly replacement of the antenna.

In many applications such as, for example, 4G (LTE) wireless systems, it may be important to avoid the generation of such PIM distortion. In general, PIM distortion reduction is important for all frequency division duplexing (FDD) communication systems, Unfortunately, conventional variable capacitors are typically implemented using PIN diodes, varactor diodes and/or micro-electromechanical systems (MEMS), all of which are inherently non-linear implementations and hence may give rise to PIM. Moreover, the development work on RF MEMS variable capacitors is not directed to capacitors that can support the power levels and/or linearity requirements needed for low third order PIM (e.g., <−150 dBc at 2×20 W tones) associated with adjustable phase shifters for base station antenna applications and the RF MEMS variable capacitors operate in a fundamentally different way from the variable capacitors according to embodiments of the present invention. Thus, the use of such conventional variable capacitors is not possible in many RF communications applications.

The adjustable phase shifters according to embodiments of the present invention may overcome various of the disadvantages of conventional adjustable phase shifters for base station antennas.

Figure 7:
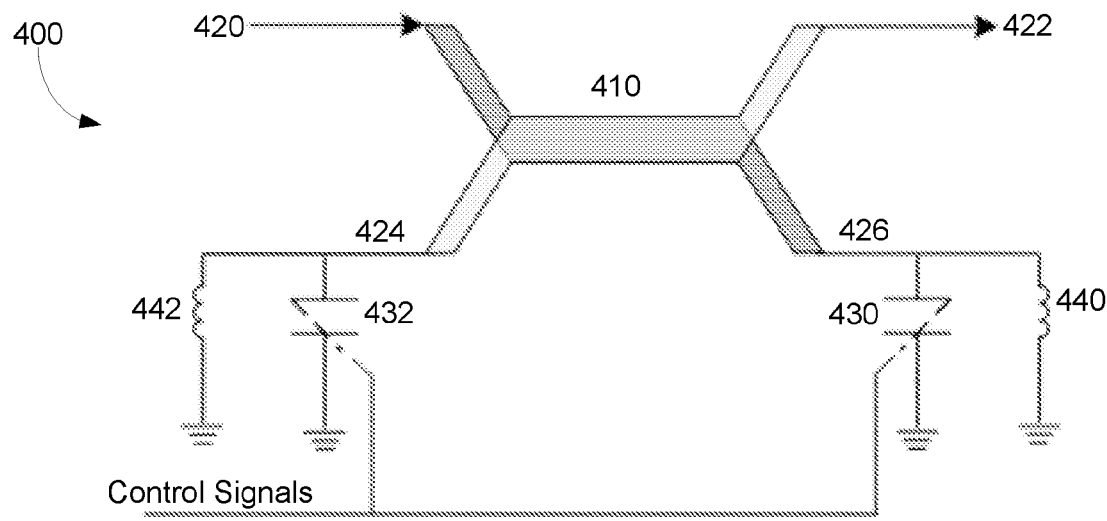
FIG. 7 is a circuit diagram of a phase shifter that is implemented using the variable capacitors according to embodiments of the present invention.

In particular, FIG. 7 is a circuit diagram of a variable phase shifter 400 that is implemented using the variable capacitors according to embodiments of the present invention that is suitable for use in base station antennas. As shown in FIG. 7, the variable phase shifter 400 comprises a four port 90 degree 3 dB hybrid coupler 410 having an input port 420, an output port 422 and first and second control ports 424, 426. The 90 degree hybrid coupler 410 may comprise, for example, a commercially available surface mount 4-port 90 degree hybrid coupler. An example of a suitable 90 degree hybrid coupler is the Xinger® brand 90 degree hybrid coupler available from Anaren®. A first variable capacitor 430 and a first inductor 440 are coupled to the first control port 424. A second variable capacitor 432 and a second inductor 442 are coupled to the second control port 426. The inductors 440, 442 may be used to increase the bandwidth of the adjustable phase shifter 400. The inductors 440, 442 may be omitted in some embodiments. One or more control signals may be used to control the first and second variable capacitors 430, 432. The first and second variable capacitors 430, 432 may be implemented using the variable capacitors according to embodiments of the present invention.

An RF input signal may be input to the input port 420. The adjustable phase shifter 400 will impart a phase shift on the RF input signal, where the amount of the phase shift will be based on the values of the variable capacitors 430, 432. Adjustable phase shifters that use a 90 degree hybrid coupler and variable capacitors are known in the art, and hence further description of the design and operation of the base circuit illustrated in FIG. 7 will be omitted herein.

It should be noted that when the variable capacitors according to embodiments of the present invention are used to implement the adjustable phase shifter 400, both DC control voltages and RF signals may be applied to the electrodes of the variable capacitor in some embodiments. The frequency of the RF signals and/or inertia of the electrostatically moveable liquid dielectric material may be sufficiently high so that the RF signals do not act as control voltages that tend to move the electrostatically movable liquid dielectric material. In some embodiments, the voltage levels of the RF signals may alternatively or additionally not be high enough to move the electrostatically movable liquid dielectric material. Thus, the adjustable phase shifters 400 may be designed so that the capacitance of the variable capacitors 430, 432 thereof may be varied in order to apply an adjustable phase shift to an input RF signal without the RF signal impacting the operation of the variable capacitors 430, 432.

Figure 8A:
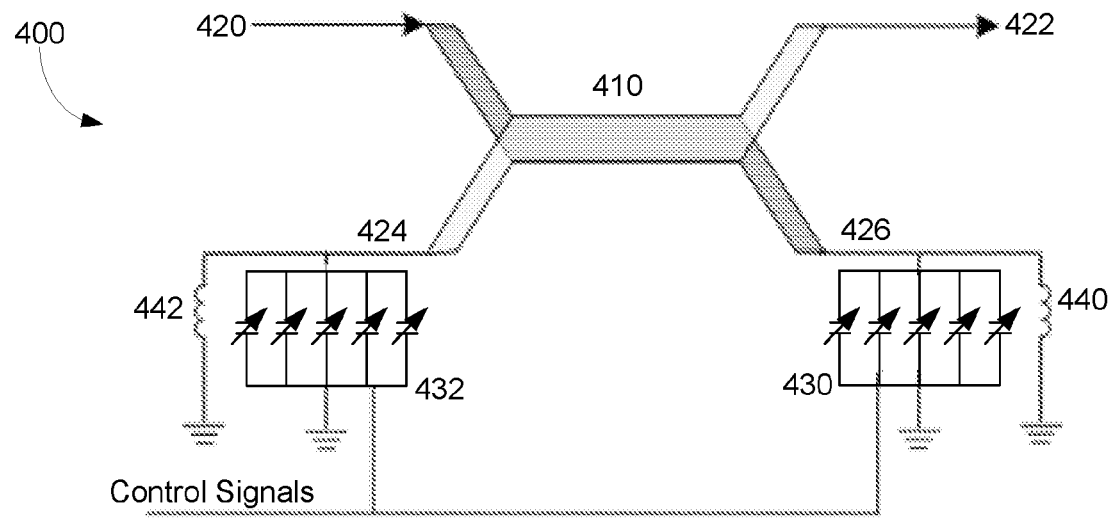
FIGS. 8A and 8B are schematic diagrams illustrating two implementations of the phase shifter of FIG. 7.
Figure 8B:
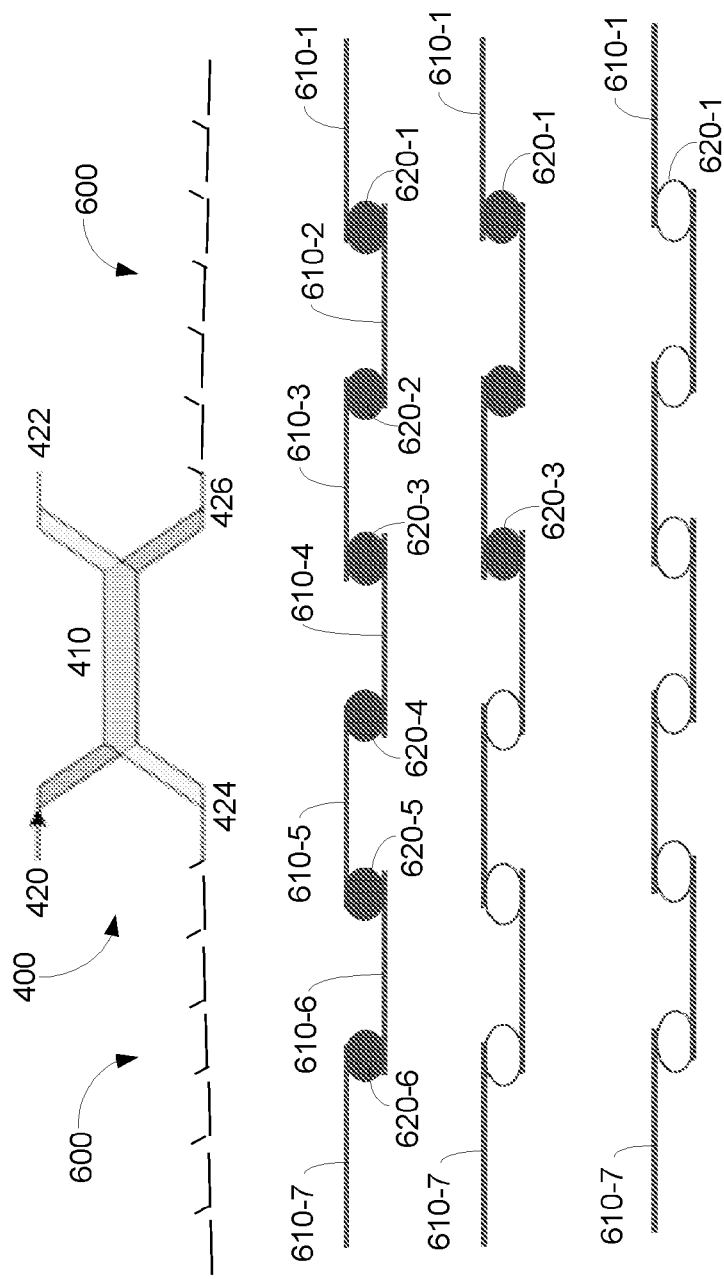

FIGS. 8A and 8B are schematic diagrams illustrating two potential implementations of variable capacitors 430, 432 included in the phase shifter of FIG. 7 using the variable capacitors according to embodiments of the present invention.

Referring first to FIG. 8A, it can be seen that the variable capacitors 430, 432 are each implemented using a plurality of the variable capacitors 100 of FIGS. 2A-2C that are disposed in parallel to form the composite variable capacitor 300 of FIG. 4. Each individual capacitor 100 may include a plurality of switches that may be used to selectively connect the electrodes 120, 130, 160 of the capacitor 100 to a DC control voltage in the manner discussed above with reference to FIGS. 5A-5B and 6. A controller 176 may be provided that is used to selectively connect the electrodes 120, 130, 160 to the DC control voltage source 170 in order to set each of the capacitors 100 into either its high capacitance state or its low capacitance state, as is discussed above with reference to FIG. 5B. The controller 176 may be a stand-alone controller, may be a controller that is used to control both of the variable capacitors 430, 432 included in the phase shifter 400, or may be a controller of the base station antenna in which the phase shifter 400 is installed. As described above, a subset of the variable capacitors 100 may be set to their high capacitance state (which subset can be all of the capacitors 100, none of the capacitors 100 or some number in between), while the remainder of the capacitors 100 are set to their low capacitance state in order to set the variable capacitors 430, 432 to capacitance levels that impart the desired amount of phase shift to the RF input signal.

Referring next to FIG. 8B, an alternative implementation of the phase shifter 400 is shown. In this embodiment, each of the variable capacitors 430, 432 is implemented as a capacitively coupled transmission line 600. As shown in FIG. 8B, each transmission line 600 may comprise a plurality of transmission line segments 610-1 through 610-7 that are connected by capacitors 620-1 through 620-6. Each of the capacitors 620 may be implemented using an electrowetting on dielectric variable capacitor according to embodiments of the present invention such as, for example, the variable capacitor 100 described above. Three example states of the transmission line 600 are schematically illustrated in FIG. 8B. In State 1, each of the variable capacitors 620 is in its high capacitance state, and hence each capacitor 620 may look almost like a short circuit, resulting in a long transmission line length. In this state, the phase shifter 400 will impart a relatively large amount of phase shift. In State 2, the first three variable capacitors 620 (i.e., the variable capacitors 620 that are on the 90 degree hybrid coupler 410 end of the transmission line 600) are in their high capacitance state, while the remaining three variable capacitors 620 are in their low capacitance state. In this state, the first three capacitors 620-1 through 620-3 each may look almost like a short circuit while the remaining three variable capacitors 620-4 through 620-6 may look almost like open circuits. This combination results in a medium length transmission line length that will result in the phase shifter 400 imparting a mid-range amount of phase shift. In State 3, each of the variable capacitors 620 is in its low capacitance state, and hence each capacitor 620 may look almost like an open circuit, resulting in a very short transmission line length. In this state, the phase shifter 400 will impart only a small amount of phase shift. It should be noted that the same effect as shown in State 3 may be achieved by merely controlling the first capacitor 620-1 to be in its low capacitance state. It will also be understood that various other phase shifts may be achieved by controlling the capacitors 620 to result in other transmission line lengths (namely lengths of anywhere between 0 and 7 transmission line segments 610). Of course it also is possible to further vary the length of the transmission line 600, and hence the phase shift (or true time delay for wide frequency band applications) imparted, by adding (or subtracting) additional transmission line segments 610 and variable capacitors 620. Phase shifters implemented using 90 degree 3 dB hybrid couplers have the advantages of a wide frequency band of operation (more than octave), but they are not only class of RF phase shifters in which the variable capacitors according to embodiments of the present invention may be used. Other types of RF phase shifters known in the art (for example, switched line and loaded line phase shifters) also can use the variable capacitors according to embodiments of the present invention.

Figure 9:
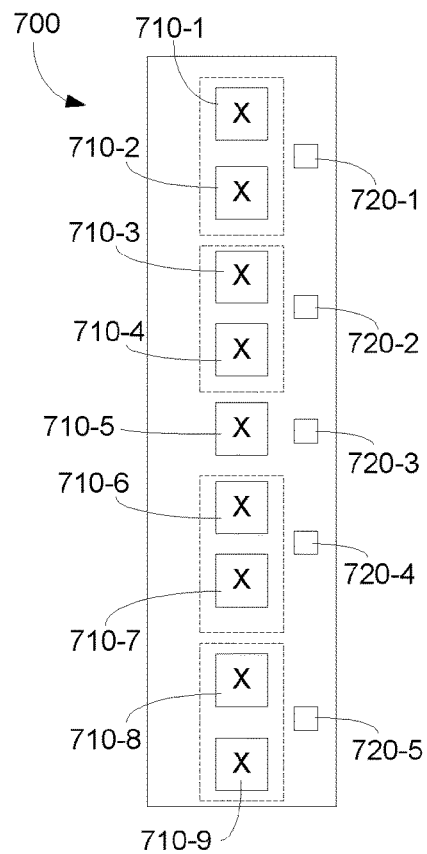
FIG. 9 is a schematic block diagram of a base station antenna implemented using phase shifters according to embodiments of the present invention.

FIG. 9 is a schematic block diagram of a base station antenna 700 implemented using phase shifters according to embodiments of the present invention.

As shown in FIG. 9, the phased array antenna 700 includes a total of nine radiating elements 710-1 through 710-9 that are arranged in numerical order in a vertical column. Herein, when a device includes include multiple of the same components, these components may be referred to individually by their full reference numerals (e.g., radiating element 710-1) and may be referred to collectively by the first part of their reference numeral (e.g., the radiating elements 710). Each radiating element 710 may comprise, for example, a pair of 45°/−45° cross-polarized dipole antennas, although embodiments of the present invention are not limited thereto. For example, in other embodiments, single dipole or patch radiating elements may be used.

As is further shown in FIG. 9, the base station antenna includes a plurality of phase shifters 720. A phase shifter 720 may be provided for each radiating element 710 or a phase shifter 720 may be coupled to a sub-group of the radiating elements 710. In the depicted embodiment, five phase shifters 720 are provided, with four of these phase shifters 720 being coupled to four respective sub-groups of two radiating elements 710 each and the fifth phase shifter 720-3 coupled to a single radiating elements 710-5. Each phase shifter 720 may be used to change the phase of signals transmitted and received through its associated radiating elements 710.

Figure 10B:
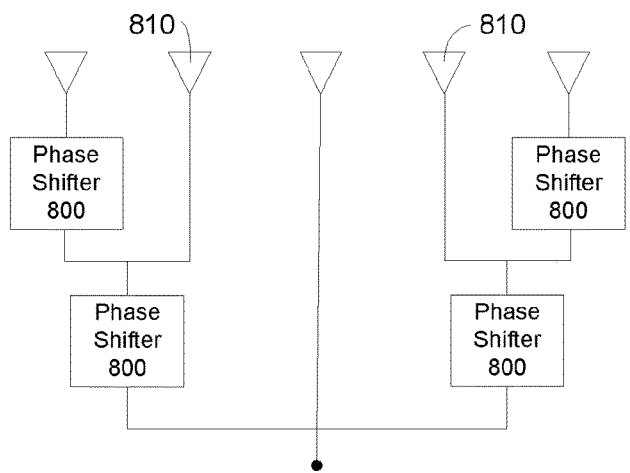
FIGS. 10A and 10B are schematic block diagrams of two phase shifter arrangements for base station antennas according to embodiments of the present invention.
Figure 10A:
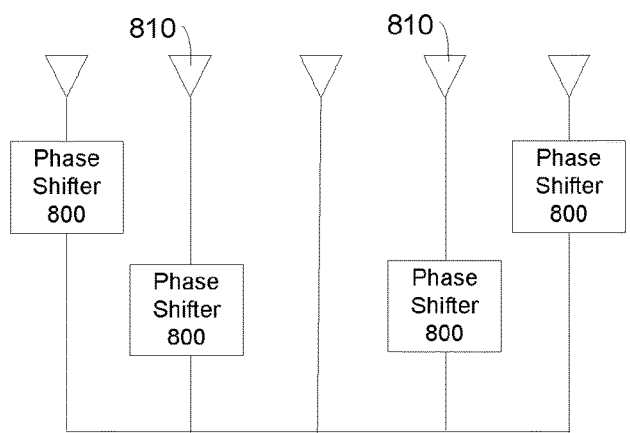

FIGS. 10A and 10B illustrate two example ways that the phase shifters according to embodiments of the present invention may be used in base station antennas.

As shown in FIG. 10A, in some embodiments, a single phase shifter 800 is provided for each radiating element or group of radiating elements 810. In this embodiment, a maximum amount of flexibility is provided in terms of the ability to individually adjust the phase at each radiating element or group of radiating elements 810. However, phase shifters 800 having a relatively large phase shift range may be required in this embodiment, requiring more variability in the capacitance of the variable capacitors and/or the length of the variable transmission line (see FIG. 8B) that are included in the phase shifters 800. As shown in FIG. 10B, in other embodiments, the phase shifters 800 may be concatenated so that the signals supplied to at least some radiating elements or groups of radiating elements 810 pass through two or more adjustable phase shifters 800. This approach may require less phase shift per phase shifter 800 and hence may allow for simpler phase shifter designs.

While the above-described phase shifters and base station antennas illustrate example electronic circuits that the electrowetting on dielectric variable capacitors according to embodiments of the present invention may be used in, it will be appreciated that these capacitors may be used in a wide variety of different circuits. As another example, tunable filters are known in the art that use variable capacitors in order to adjust the frequency response of the filter. The variable capacitors according to embodiments of the present invention may similarly be used in implementing such tunable filters.

Pursuant to further embodiments of the present invention, electronic phase shifters are provided that may be formed from a plurality of unit cells, where each unit cell may include, for example, two delay lines of different lengths and a plurality of switches. The switches may be electronically controlled to select one of the two delay lines. RF signals may then be transmitted through the unit cell and will experience a phase shift that corresponds to a phase shift associated with the selected delay line (which phase shift will be a function of the length of the delay line and the center frequency of the RF signal). An example embodiment of such an electronic phase shifter and the switches that are used to implement it will now be discussed with reference to FIGS. 12-16E.

Figure 12:
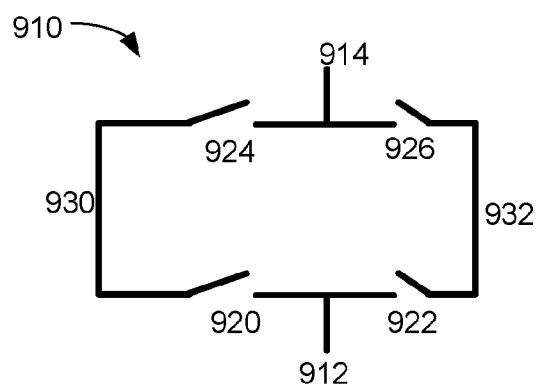
FIG. 12 is a high-level circuit diagram of a unit cell of an electronic phase shifter according to further embodiments of the present invention.

FIG. 12 is a circuit diagram of a unit cell 910 of an electronic phase shifter 900 according to further embodiments of the present invention. As will be explained in greater detail below, the unit cell 910 of FIG. 12 may be used as a building block to create the phase shifter 900. The phase shifter 900 may be a high performance, low PIM distortion phase shifter.

As shown in FIG. 12, the unit cell 910 includes an input 912, an output 914, four switches 920, 922, 924, 926 and a pair of delay lines 930, 932. The switches 920, 922, 924, 926 may be set to allow an RF signal that is input at input 912 to traverse one of the two delay lines 930, 932 before exiting the unit cell 910 at the output 914. In particular, by closing switches 920 and 924 and opening switches 922 and 926, an RF signal that is incident at the input 912 of the unit cell 910 will traverse the first delay line 930 and be blocked from traversing the second delay line 932. Alternatively, by closing switches 922 and 926 and opening switches 920 and 924, an RF signal that is incident at the input 912 of the unit cell 910 will traverse the second delay line 932 and be blocked from traversing the first delay line 930. The delay lines 930, 932 have different lengths, and hence the RF signal that is input to the unit cell will undergo a different phase shift depending upon which delay line 930, 932 the RF signal traverses. Thus, the unit cell 910 may be used to selectively apply one of two different phase shifts to RF signals that are input thereto.

Figure 13A:
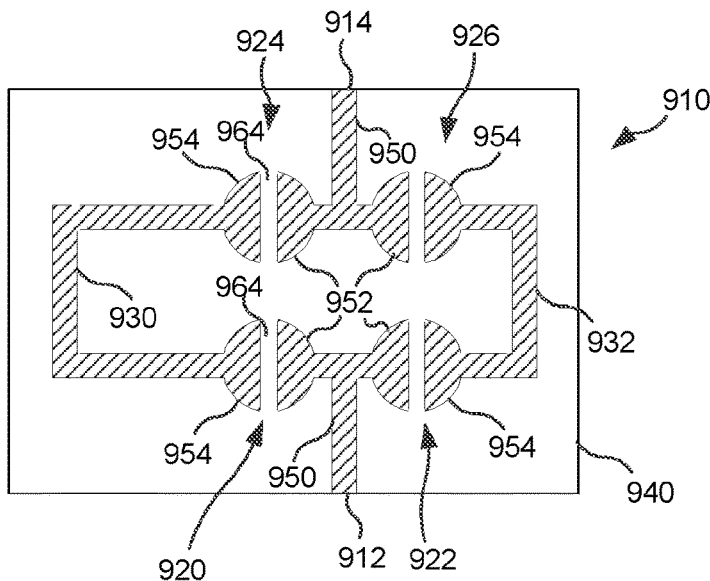
FIGS. 13A through 13D are schematic views of various elements of an example embodiment of the unit cell of FIG. 12.
Figure 13B:
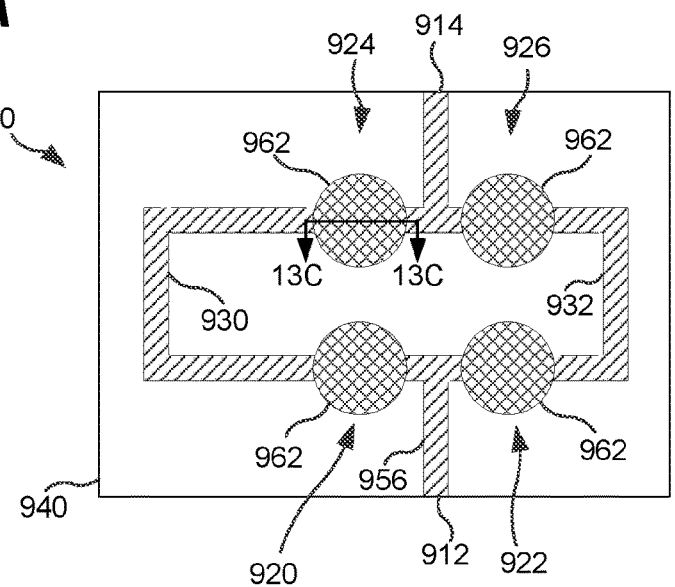
Figure 13C:
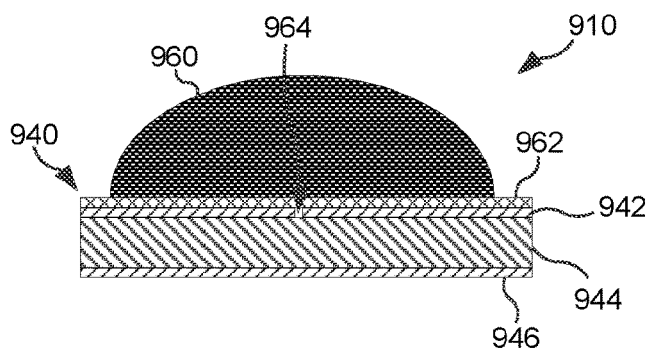
Figure 13D:
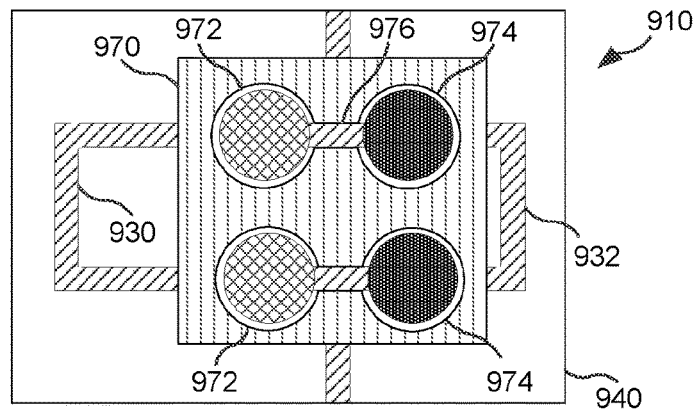

FIGS. 13A through 13D are schematic views of various elements of an example embodiment of the unit cell 910 of FIG. 12. The unit cell 910 is implemented on a printed circuit board 940. FIG. 13A is a plan view showing the conductive traces on the top surface of the printed circuit board 940. FIG. 13B is a plan view of the printed circuit board 940 after a dielectric coating has been formed on top of metallized pads on the printed circuit board that form the bottom electrodes of each switch 920, 922, 924, 926. FIG. 13C is a cross-sectional view of a portion of the printed circuit board that further illustrates the construction of one of the switches 920, and shows how a droplet of liquid metal may act as the top electrode for the pair of capacitors that form the switch. Finally, FIG. 13D is a schematic plan view of the unit cell 910 that illustrates how each droplet of liquid metal may be contained within a respective dumbbell-shaped container to facilitate moving the droplets between respective pairs of switches so as to close one switch of the pair while opening the other switch of the pair.

Referring to FIGS. 13A and 13C, the unit cell 910 is implemented on a printed circuit board 940. The printed circuit board 940 may include a dielectric substrate 944, and a metal ground plane 946 may be formed on the lower surface thereof. Conductive traces 942 may be formed on the upper side of the dielectric substrate 944. These conductive traces 942, in conjunction with the underlying ground plane 946, serve as RF transmission lines. As shown in FIG. 13A, a variety of different types of conductive traces 942 are provided on the top surface of the printed circuit board 940. The conductive traces 942 include an input trace 950 that serves as the input 912 to the unit cell 910. The conductive traces 942 further include switch pads 952, 954. Each pair of switch pads 952, 954 acts as the respective bottom electrodes of a pair of capacitors that are used to form each of the switches 920, 922, 924, 926. Accordingly, the printed circuit board 940 includes four switch pads 952 and four switch pads 954. The conductive traces 942 further include delay lines 930, 932, which are simply transmission line segments. The delay lines 930 and 932 have different lengths so as to generate different phase shifts. Finally, the conductive traces 942 further include an output trace 958 that serves as the output 914 of the unit cell 910.

As is also shown in FIG. 13A, the input trace 950 connects to the switch pads 952 of switches 920 and 922 and the output trace 958 connects to the switch pads 952 of switches 924 and 926. Switch pad 954 of switch 920 connects to a first end of the first delay line 930, and switch pad 954 of switch 922 connects to a first end of the second delay line 932. The second end of the first delay line 930 connects to switch pad 954 of switch 924, and the second end of the second delay line 932 connects to switch pad 954 of switch 926. The first and second delay lines 930, 932 have different lengths so that an RF signal traversing the first delay line 930 will undergo a different phase shift than will an RF signal traversing the second delay line 932.

The unit cell 910 operates by moving two droplets of a liquid metal 960 between respective first and second positions in order to open and close the switches 920, 922, 924, 926 so that an RF signal that is input to the unit cell 910 may traverse either the delay line 930 or the delay line 932. Switches 920 and 922 are operated as a pair so that one of the switches 920, 922 will be closed and the other will be opened during normal operation. Likewise, switches 924 and 926 are operated as a pair so that one of the switches 924, 926 will be closed and the other will be opened during normal operation.

Referring to FIGS. 13A-13C, it can be seen that each switch 920, 922, 924, 926 comprises a first switch pad 952, a second switch pad 954, a dielectric coating 962 and a droplet of liquid metal 960. The switch pads 952 and 954 are separated from each other by a gap 964 so that switch pads 952 and 954 are not in direct ohmic contact with each other. The gap 964 may be sufficiently large so that significant capacitive coupling does not occur between switch pads 952 and 954. Accordingly, the gaps 964 included in switches 920 and 922 effectively block an RF signal that is incident on input trace 950 from passing to switch pads 954 of switches 920 or 922. Likewise, the gaps 964 included in switches 924 and 926 effectively block an RF signal that is incident on switch pads 954 of either switch 924 or 926 from passing to switch pads 952 of switches 924, 926 and from there to the output trace 958.

As shown in FIGS. 13B-13D, a dielectric material 962 such as, for example, a coating of solder mask, polyimide, parylene, or other insulating materials, may be formed on top of the each pair of switch pads 952, 954. A first container 970 that includes a drop of liquid metal 960 (see FIG. 13D) extends over the switch pads 952, 954 and dielectric coating 962 of switches 920 and 922. A second container 970 that includes a second drop of liquid metal 960 (see FIG. 13D) extends over the switch pads 952, 954 and dielectric coating 962 of switches 924 and 926. The switch pads 952, 954, dielectric coating 962 and droplet of liquid metal 960 associated with each switch form a pair of capacitors that may be used to selectively allow an RF signal that is input at one side of one of the switches to pass to the opposite side of the switch.

In particular, each switch pad 952 acts as a lower electrode of a first capacitor. Each switch pad 954 acts as a lower electrode of a second capacitor. The dielectric coating 962 acts as the dielectric of the first and second capacitors. The droplet of liquid metal 960, if present, act as the upper electrodes of the first and second capacitors. As can be seen in FIG. 13C, if the droplet of liquid metal 960 is present above the switch pads 952, 954 of a given one of the switches 920, 922, 924, 926, then an RF signal that is incident on switch pad 952 will capacitively couple through the dielectric coating 962 to a portion of the droplet of liquid metal 960 (the portion on the right side of FIG. 13C). The RF signal will pass through the droplet of liquid metal 960 and then capacitively couple from another portion of the drop of liquid metal 960 (the portion on the left side of FIG. 13C) to the switch pad 954. Thus, when the drop of liquid metal 960 is disposed over the switch pads 952, 954 of a given switch, the switch is effectively closed and RF signals may pass therethrough. In contrast, if the drop of liquid metal 960 is not present over the switch pads 952, 954 then the associated switch is effectively opened and RF signals may not pass therethrough.

FIG. 13D schematically illustrates the two containers 970 that hold the droplets of liquid metal 960. The containers 970 may be formed, for example, of solid dielectric material such as polyimide that has low adhesion characteristics to the liquid metal 960. Two individual containers 970 may be provided or a single container that has two cavities (as shown). As shown in FIG. 13D, each container 970 may have a barbell-shaped cavity that includes first and second chambers 972, 974 and a channel 976 extending therebetween. A droplet of liquid metal 960 and an electrolyte such as saline solution, hydrochloric acid or the like may be disposed within each container 970. Each chamber 972, 974 is positioned directly above a respective one of the pairs of switch pads 952, 954. The channel 976 allows the liquid metal 960 to be moved between the chambers 972, 974. As described above with respect to the various variable capacitors disclosed herein, electrowetting techniques may be used to move each drop of liquid metal 960 from one of the chambers 972, 974 to the other chamber 972, 974 in response to electrical control signals. Accordingly, electrical control signals may be used to move the first drop of liquid metal 960 to be disposed over the switch pads 952, 954 of either switch 922 or switch 924, and may also used to move the second drop of liquid metal 960 to be disposed over the switch pads 952, 954 of either switch 924 or switch 926. If the drops of liquid metal 960 are controlled to be disposed over the switch pads 952, 954 of switches 920 and 924, then these switches are closed and RF signals that are input to the unit cell 910 may traverse the first delay line 930 but cannot traverse the second delay line 932. If instead the drops of liquid metal 960 are controlled to be disposed over the switch pads 952, 954 of switches 922 and 926, then these switches are closed and RF signals that are input to the unit cell 910 may traverse the second delay line 932 but cannot traverse the first delay line 930. By making the difference in line length of the delay lines 930, 932 to be equal to the desired phase shifts, the unit cell 910 provides a switched phase state. As will be discussed in detail below, by cascading multiple sections of this unit cell 910 it is possible to construct a binary phase shifter having a full 360 degree phase shift.

A variety of liquid metals may be used for the drops of liquid metal 960. In example embodiments, the liquid metal may be eutectic gallium indium, galistan or mercury. Other liquid metals may also be used.

As discussed above, the switches 920, 922, 924, 926 operate using electrowetting techniques to selectively open and close an electrical path. Herein, switches that operate in such a manner may be referred to as "electrowetting-activated" switches. References are also made herein to a "droplet" of liquid metal. It will be appreciated that the term "droplet" is used to refer to a small amount of liquid metal that can be a single droplet or a plurality of droplets.

Figure 14A:
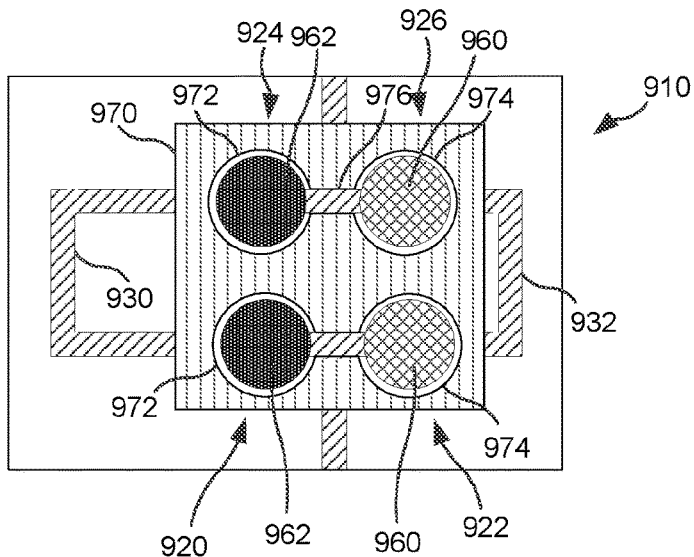
FIGS. 14A and 14B are schematic plan views illustrating placement of the liquid metal drops for the two possible switch states of the unit cell of FIGS. 13A-13D.
Figure 14B:
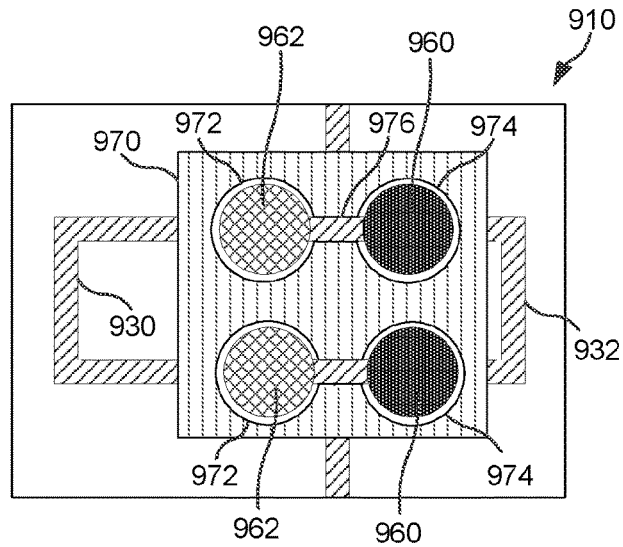

FIGS. 14A and 14B are schematic plan views illustrating placement of the liquid metal drops for the two possible states of the switches 920, 922, 924, 926 included in the unit cell of FIGS. 13A-13D. As shown in FIG. 14A, when the liquid metal droplets 960 are positioned in the two left side chambers 972 of containers 970, an RF signal incident at input 912 passes through the first delay line 930 and encounters the associated delay with this path. When the liquid metal droplets 960 are positioned in the two right side chambers 974, an RF signal incident at input 912 passes through the second delay line 932 and encounters the associated delay with this path.

The unit cell 910 that is described above uses capacitive connections between the liquid metal and the switch pads 952, 954; in other embodiments it may be possible to use a direct galvanic connection instead. In such embodiments, the dielectric coating 962 may be omitted so that the drop of liquid metal 960 provides a direct electrical connection from the input trace 950 (or output trace 958) to the switch pads 952 and 954.

Figure 15:
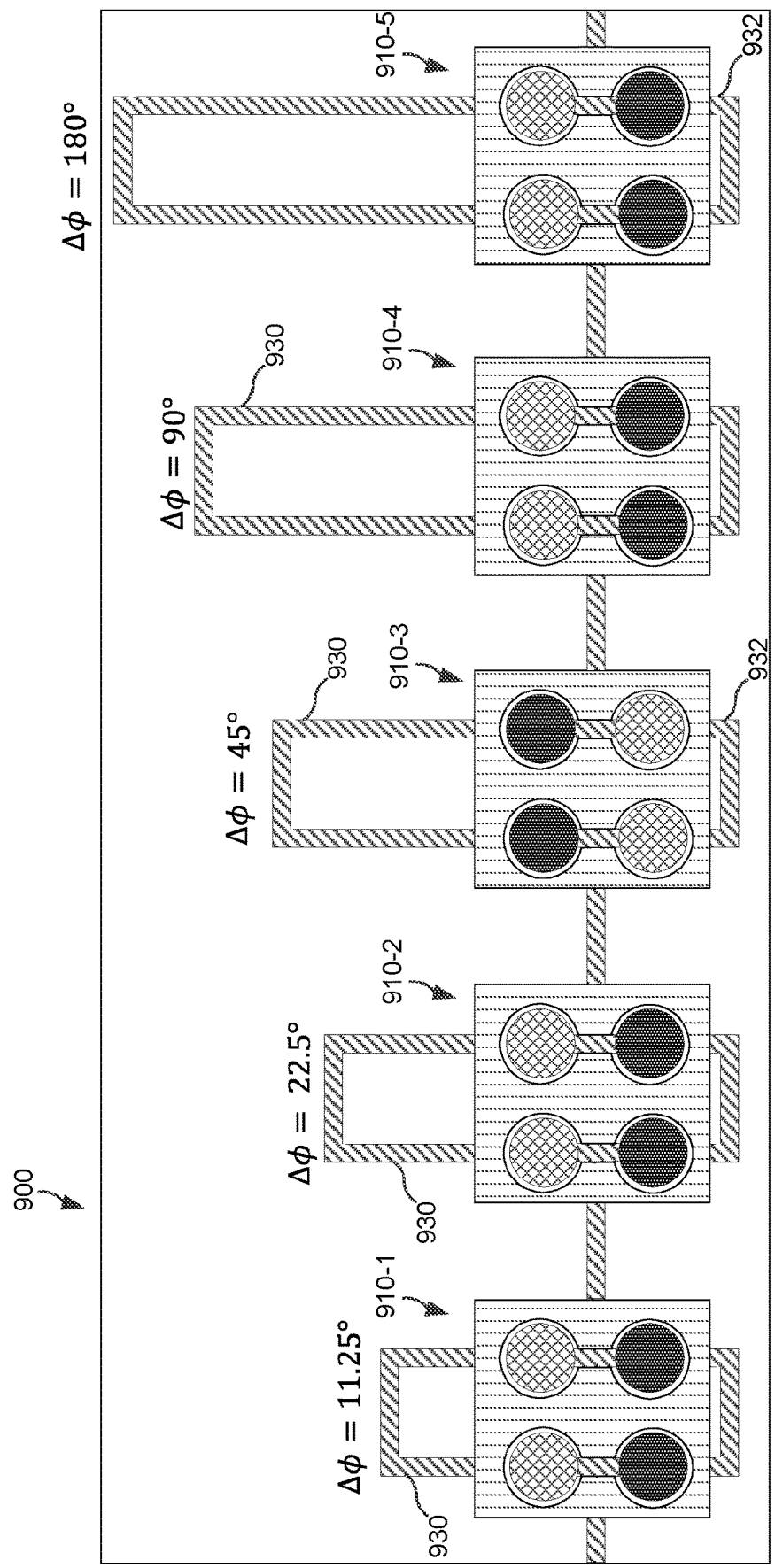
FIG. 15 is a schematic plan view of a phase shifter implemented using a plurality of the unit cells of FIGS. 13A-13D.
Figure 16:
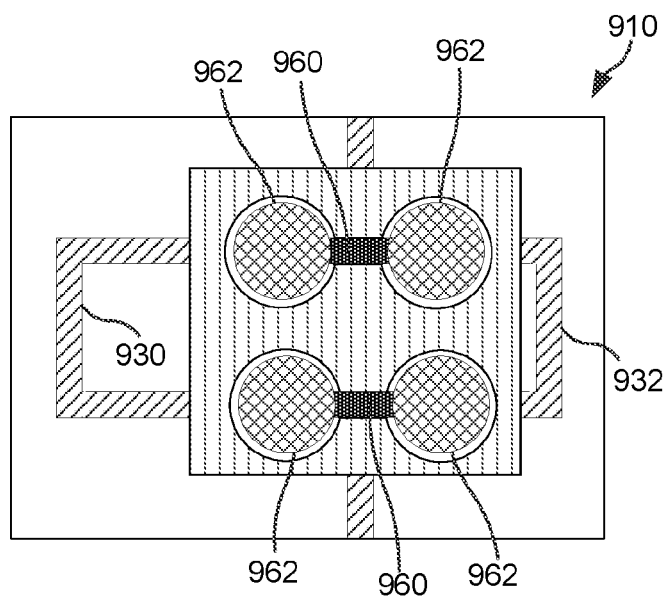
FIG. 16 is a schematic plan view of the unit cell of FIGS. 13A-13D when the liquid metal droplets are transitioning between chambers.
Figure 17A:
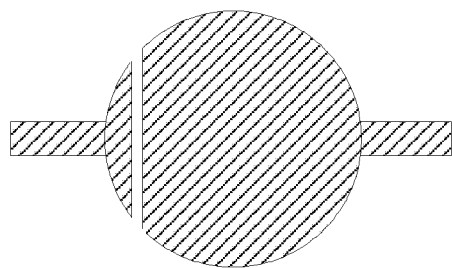
FIGS. 17A-17D are schematic plan views of alternative implementations of the switch pads included in the switches of the unit cell of FIGS. 13A-13D.
Figure 17B:
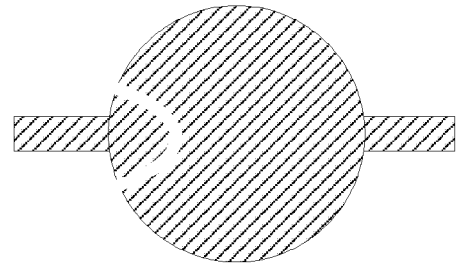
Figure 17C:
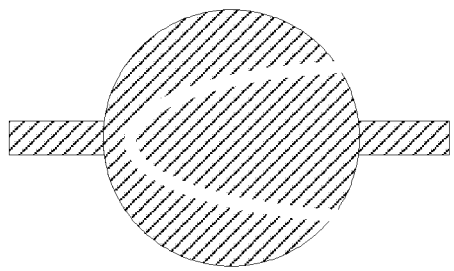
Figure 17D:
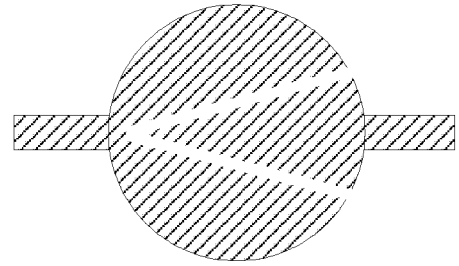

As noted above, a plurality of the unit cells 910 may be used to form a phase shifter. FIG. 15 is a schematic plan view of a phase shifter 900 implemented using several of the unit cells 910 of FIGS. 13A-13D. The phase shifter 900 may be implemented using a plurality of unit cells 910. Each unit cell 910 may be designed to impart the same amount of phase shift or the unit cells 910 may be designed to impart different amounts of phase shift. FIG. 15 illustrates a phase shifter 900 using unit cells 910 that impart different amounts of phase shift.

As shown in FIG. 15, the phase shifter 900 may include, for example, five unit cells 910. The particular phase shifter depicted in FIG. 15 may impart any phase shift in the range of 0 to 348.75 degrees with a minimum step size of 11.25 degrees. As shown in FIG. 15, in some embodiments, the difference in the phase shifts imparted by the first and second delay lines in each unit cell may be the important parameter. In unit cell 910-1, the difference in the phase shifts imparted by delay lines 930 and 932 is 11.25 degrees. For unit cell 910-2, this difference is doubled to be 22.5 degrees. The third, fourth and fifth unit cells 910-3 through 910-5 each again double the phase shift difference to provide phase shift differences of 45 degrees, 90 degrees and 180 degrees. With each unit cell 910 being independently controlled, a phase shift can be induced on an RF signal from a reference 0 degree phase shift (which occurs if the delay line 932 is selected in each unit cell 910) up to a phase shift of 348.75 degrees shift (which occurs if the delay line 930 is selected in each unit cell 910). Any intermediate phase shift may be selected (with a step size of 11.25 degrees) by selecting different combinations of delay lines 930 and 932 in the different unit cells 910. When configured as shown in FIG. 15, the phase shifter 900 will impart a differential phase shift of 45°.

As shown in FIG. 13A, in an example embodiment, each switch pad 952, 954 may comprise a semicircular metal pad, where the straight edges face each other. In many cases, the phase shift that is applied to an RF signal may change while an RF signal is passing through the phase shifter 900. The RF signal may be a high power signal that is transmitted from a power amplifier, and such signals should not be presented with an open circuit during active transmission. During the transient conditions that occur when the unit cells 910 are controlled to reconfigure the switch settings thereof, the liquid metal 960 is moved from one chamber 972, 974 to the other, and thus the liquid metal 960 can be distributed in the channel 976 (and may also be partially in each chamber 972, 974 depending upon the relative volumes of the chambers 972, 974 and the channel 976). While the semicircular switch pad geometry that would provide the greatest capacitance to the liquid metal droplet 960 is that shown in FIG. 13A, this geometry would have the risk of allowing an open circuit condition through the unit cell 910 during transition of the liquid metal droplet 960.

FIGS. 17A-17D are schematic plan views of alternate implementations of the switch pads 952, 954 included in the switches 920, 922, 924, 926 of the unit cell 910 of FIGS. 13A-13D that may be less susceptible to fully open circuit conditions during stage transition. Each of switch pad pairs 952, 954 shown in FIGS. 17A-17D allow concurrent closure on both switches of the phase shifter during the transition state to form a make-before-break switch function. In embodiments which use direct ohmic contacts (as opposed to capacitive connections), the second switch will make full contact before full contact is lost on the first switch of the pair. In embodiments where capacitive switches are used, the reactance through the second switch will gradually decrease to form partial contact through both branches of the phase shifter before the first switch is fully open. It will be appreciated that other geometries may provide the same effect.

Figure 18:
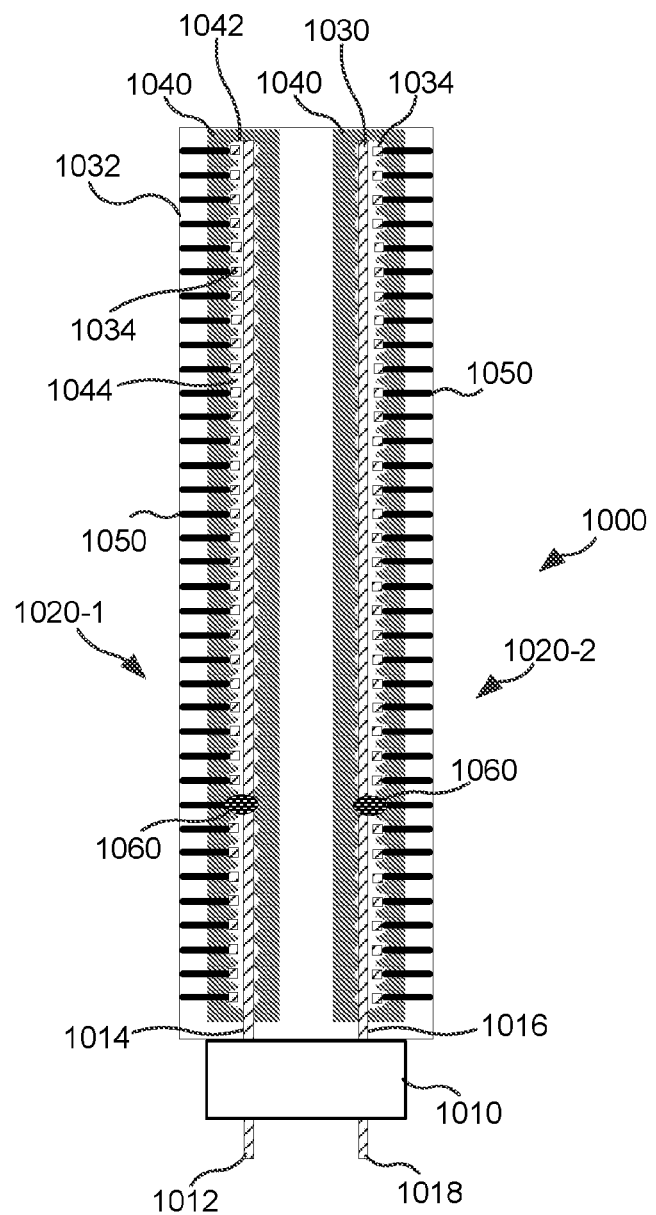
FIG. 18 is a schematic diagram of a phase shifter according to still further embodiments of the present invention.

FIG. 18 is a schematic diagram of a phase shifter 1000 according to still further embodiments of the present invention.

As shown in FIG. 18, the phase shifter 1000 comprises a hybrid coupler 1010 and a pair of variable delay lines 1020-1, 1020-2. The hybrid coupler 1010 includes an input port 1012, an output port 1018 and a pair of coupled ports 1014, 1016. Each delay line 1020 may comprise, for example, a microstrip transmission line 1030 that is formed on a printed circuit board 1032. A ground plane (not shown) may be formed on the underside of the printed circuit board 1032, and a signal carrying trace of the transmission line is formed on the top side of the printed circuit board 1032. A plurality of ground pads 1034 are formed on the printed circuit board 1032 adjacent the transmission line 1030. A containment structure 1040 that includes a plurality of chambers 1042 that are connected by channels 1044 is provided above the transmission line 1030. A droplet of liquid metal 1060 is disposed within the containment structure 1040, along with an electrolyte liquid (not shown). A plurality of control lines 1050 are also provided that may receive direct current ("DC") electrical signals.

In this embodiment, a DC signal may be applied to selected ones of the control lines 1050 to move the liquid metal droplet 1060 in each containment structure 1040 into a selected one of the chambers 1042. Each liquid metal droplet 1060 creates a short circuit between its associated transmission line 1030 and the ground pad 1034 that is exposed within the chamber 1042. Each ground pad 1034 may be connected to the ground plane on the underside of the printed circuit board 1032 on which the transmission lines 1030 are formed. The short circuit acts as an impedance mismatch that reflects an RF signal that is injected onto the transmission line 1030 back towards the hybrid coupler 1010. The RF signal therefore is transmitted down what in effect is a delay line having a length that is about twice the length of the portion of the transmission line 1030 between the hybrid coupler 1010 and the short circuit. Since the location of the short circuit is adjustable, the device may act as an adjustable phase shifter that phase shifts an RF signal applied thereto. The length of the microstrip transmission line 1030 may be based on the required maximum delay setting.

Two transmission lines 1030 are provided since the hybrid coupler 1010 is a four-port device. The liquid metal droplets 1060 are moved to the same chambers 1042 (i.e., to chambers 1042 that are the same distance from the hybrid coupler 1010) in the containment structure 1040 so that the delay along each transmission line 1030 is equal. This may ensure that a portion of the RF signal is not reflected back to the input port 1012 and instead substantially all of the RF signal that is input at port 1012 will pass to the output port 1018. The liquid metal droplets 1060 are actuated into a selected chamber 1042 by application of DC voltage to the corresponding DC control line 1050. An individual actuation voltage can be applied to control lines 1050 along each transmission line 1030 to ensure both liquid metal droplets 1060 are positioned in locations that provide the same amount of delay. The corresponding DC control lines 1050 on each of the two transmission lines 1030 are enabled simultaneously to position both liquid metal droplets 1060 into such corresponding positions.

The linear phase shifter 1000 can be sequenced between linear setting. Therefore, if a full 360 degree phase shift is desired in minimum increments of 10 degrees, then 36 discrete chambers 1042 may be formed along each transmission line with 36 individual DC control lines 1050, namely one for each chamber 1042. This will ensure actuation and positioning of the two liquid metal droplets 1060 into the appropriate locations.

Phase shifters that are implemented using the variable capacitors and electrowetting-activated switches according to embodiments of the present invention may exhibit a number of advantages. For example, the phase shifters may be small and lightweight. The phase-changing time can be much shorter (by a factor of 100 or more) than the phase changing times for conventional electro-mechanical phase shifters. Additionally, the phase shifters do not require motors and/or mechanical linkages as do conventional electro-mechanical wiper-arm phase shifters that are conventionally used in base station antennas. This again may decrease the cost and weight of the antenna while increasing the reliability thereof together with low PIM performance.

Additionally, the phase shifters according to some embodiments of the present invention may be implemented, for example, on the feedboards for the radiating elements. Consequently, the additional soldered coaxial cabling connections that are required when using electromechanical wiper-arm phase shifters are not required with the phase shifters according to embodiments of the present invention. Elimination of these soldered connections simplifies manufacturing and testing and enhances reliability as solder joints are a known point of potential failure. Additionally, as discussed above, solder connections are a potential source of PIM distortion, and hence elimination of solder joints may lead to improvement in the RF performance of the antenna. PIM reduction is very important for contemporary LTE systems. Thus, the base station antennas according to embodiments of the present invention may have reduced cost, improved performance and/or increased reliability.

The above-described phase shifters according to embodiments of the present invention may be used to electronically downtilt a beam of a base station antenna. Such downtilting is typically only performed occasionally in order to effect a desired change in the coverage area (e.g., to accommodate the addition of new base station nearby that will take over a portion of the coverage area). However, it will also be understood that the phase shifters that are disclosed herein may also be used in a wide variety of other applications. For example, with the introduction of 5G cellular service it is anticipated that larger, two dimensional antenna arrays that may include large numbers of radiating elements (e.g., 64, 100, 256, etc.) may be used to adaptively form antenna beams that point directly at individual users with high gain. Such beam pointing is accomplished by transmitting (or receiving) a signal through a plurality of the radiating elements of the antenna where the signal at each radiating element is phase shifted. In other applications, beam steering may be done on an intermediate scale such as pointing beams at buildings during the day and at streets during rush hour or to provide service to crowds (e.g., pointing beams at a stadium during a sporting event). In each case, the adjustable phase shifters according to embodiments of the present invention may be used to perform the phase shifting in order to steer/shape the antenna beams.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

All embodiments can be combined in any way and/or combination.

That which is claimed is:

1. An adjustable phase shifter, comprising:
   a radio frequency ("RF") signal input;
   an RF signal output;
   a first delay line;
   a second delay line;
   a first electrowetting-activated switch configured to selectively open and close an electrical path between the RF signal input and the RF signal output.

2. The adjustable phase shifter of claim 1, further comprising a second electrowetting-activated switch, wherein the first electrowetting-activated switch is coupled between the RF signal input and a first end of the first delay line and the second electrowetting-activated switch is coupled between a second end of the first delay line and the RF signal output.

3. The adjustable phase shifter of claim 2, further comprising a third electrowetting-activated switch and a fourth electrowetting-activated switch, wherein the third electrowetting-activated switch is coupled between the RF signal input and a first end of the second delay line and the fourth electrowetting-activated switch is coupled between a second end of the second delay line and the RF signal output.

4. The adjustable phase shifter of claim 1, wherein the first delay line is longer than the second delay line.

5. The adjustable phase shifter of claim 1, wherein the first electrowetting-activated switch comprises a first switch pad, a second switch pad and a first liquid metal droplet that is configured to selectively electrically connect the first switch pad to the second switch pad.

6. The adjustable phase shifter of claim 5, wherein the first switch pad is larger than the second switch pad.

7. The adjustable phase shifter of claim 6, wherein the first electrowetting-activated switch selectively couples the first delay line to a ground pad.

8. The adjustable phase shifter of claim 1,
   wherein the RF signal input, the RF signal output, the first delay line, the second delay line and the first electrowetting-activated switch form a first unit cell of the adjustable phase shifter, the adjustable phase shifter including at least a second unit cell coupled in series with the first unit cell, and
   wherein the first delay line of the second unit cell is longer than both the first delay line and the second delay line of the first unit cell.

9. The adjustable phase shifter of claim 1, further comprising a hybrid coupler, wherein the RF input is coupled to a first port of the hybrid coupler, the first delay line is coupled to a second port of the hybrid coupler, the second delay line is coupled to a third port of the hybrid coupler, and the RF output is coupled to a fourth port of the hybrid coupler.

10. The adjustable phase shifter of claim 1, wherein the first electrowetting-activated switch is configured to move a droplet of liquid metal to open or close the electrical path.

11. An adjustable phase shifter, comprising:
    a radio frequency ("RF") signal input;
    an RF signal output;
    a first delay line;
    a first electrowetting-activated switch that is configured to selectively make and break an electrical connection between the RF signal input and a first end of the first delay line; and
    a second electrowetting-activated switch that is configured to selectively make and break an electrical connection between the RF signal output and a second end of the first delay line.

12. The adjustable phase shifter of claim 11, wherein the first electrowetting-activated switch comprises a first conductive pad, a second conductive pad and a first droplet of liquid metal that is disposed within a first container and configured to selectively electrically connect the first conductive pad to the second conductive pad.

13. The adjustable phase shifter of claim 11, further comprising:
    a second delay line;
    a third electrowetting-activated switch that is disposed between the RF signal input and a first end of the second delay line; and
    a fourth electrowetting-activated switch that is disposed between the RF signal output and a second end of the second delay line.

14. The adjustable phase shifter of claim 13, wherein the fourth electrowetting-activated switch comprises a third conductive pad, a fourth conductive pad and a second droplet of liquid metal that is disposed within a second container and configured to selectively electrically connect the third conductive pad to the fourth conductive pad.

15. An adjustable phase shifter, comprising:
    a hybrid coupler that has a first port coupled to a radio frequency ("RF") input, a second port coupled to a first variable delay line, a third port coupled to a second variable delay line and a fourth port coupled to an RF output,
    wherein a first length of the first variable delay line is adjustable by using electrical control signals to control a position of a droplet of liquid material along the first variable delay line.

16. The adjustable phase shifter of claim 15, wherein the droplet of liquid material is a droplet of liquid metal.

17. The adjustable phase shifter of claim 16, wherein the droplet of liquid metal is configured for movement to selectively couple the first variable delay line to a respective one of a plurality of ground connections.

18. A phase shifter comprising:
a first unit cell comprising first and second switches that are coupled to each other by a first delay line having a first length; and
a second unit cell comprising third and fourth switches that are coupled to each other by a second delay line having a second length that is longer than the first length,
wherein the first unit cell is coupled in series with the second unit cell, and
wherein the first unit cell further comprises a third delay line having a third length that is shorter than the first length.

19. The phase shifter of claim 18,
wherein the second unit cell further comprises a fourth delay line having a fourth length that is shorter than the second length.

20. The phase shifter of claim 19, wherein the second delay line provides a delay that is about twice a delay of the first delay line.

21. The phase shifter of claim 19, further comprising a fifth delay line that provides a delay that is four times a delay of the first delay line.

22. The phase shifter of claim 19, further comprising a fifth delay line that provides a delay that is eight times a delay of the first delay line.

23. The phase shifter of claim 18, wherein the phase shifter is part of a base station antenna.

\* \* \* \* \*